(12) United States Patent
Gunjishima et al.

(10) Patent No.: US 9,096,947 B2
(45) Date of Patent: Aug. 4, 2015

(54) SIC SINGLE CRYSTAL, PRODUCTION METHOD THEREFOR, SIC WAFER AND SEMICONDUCTOR DEVICE

(75) Inventors: Itaru Gunjishima, Nagakute (JP); Keisuke Shigetoh, Nagoya (JP); Yasushi Urakami, Obu (JP); Masanori Yamada, Nagoya (JP); Ayumu Adachi, Toyota (JP); Masakazu Kobayashi, Chichibu (JP)

(73) Assignees: KABUSHIKI KAISHA TOYOTA CHUO KENKYUSHO, Aichi-ken (JP); DENSO CORPORATION, Aichi-ken (JP); SHOWA DENKO K.K., Tokyo-to (JP)

(*) Notice: Subject to any disclaimer, the term of this patent is extended or adjusted under 35 U.S.C. 154(b) by 0 days.

(21) Appl. No.: 14/119,710

(22) PCT Filed: Jun. 4, 2012

(86) PCT No.: PCT/JP2012/064398
§ 371 (c)(1), (2), (4) Date: Nov. 22, 2013

(87) PCT Pub. No.: WO2012/169465
PCT Pub. Date: Dec. 13, 2012

(65) Prior Publication Data
US 2014/0091325 A1  Apr. 3, 2014

(30) Foreign Application Priority Data
Jun. 5, 2011 (JP) .................. 2011-125886

(51) Int. Cl.
*H01L 21/00* (2006.01)
*C30B 23/02* (2006.01)
(Continued)

(52) U.S. Cl.
CPC ............. *C30B 23/025* (2013.01); *C30B 23/005* (2013.01); *C30B 29/36* (2013.01);
(Continued)

(58) Field of Classification Search
CPC ...... C30B 29/36; C30B 23/025; C30B 23/02; C30B 23/005; H01L 29/045; H01L 29/1608; H01L 21/02378; H01L 21/02529; H01L 21/0243; H01L 21/02433; H01L 21/02609; H01L 21/02587; Y10T 428/21
USPC .................................. 438/22, 105; 257/77, 93
See application file for complete search history.

(56) References Cited

U.S. PATENT DOCUMENTS

2002/0028564 A1   3/2002  Motoki et al.
2003/0070611 A1   4/2003  Nakamura et al.
(Continued)

FOREIGN PATENT DOCUMENTS

JP   5-262599   10/1993
JP   7-267795   10/1995
(Continued)

OTHER PUBLICATIONS
International Search Report issued Sep. 11, 2012, in International Application No. PCT/JP2012/064398.
(Continued)

*Primary Examiner* — Dung Le
(74) *Attorney, Agent, or Firm* — Oblon, McClelland, Maier & Neustadt, L.L.P.

(57) ABSTRACT

When an SiC single crystal having a large diameter of a {0001} plane is produced by repeating a-plane growth, the a-plane growth of the SiC single crystal is carried out so that a ratio $S_{facet}$ ($=S_1 \times 100/S_2$) of an area ($S_1$) of a Si-plane side facet region to a total area ($S_2$) of the growth plane is maintained at 20% or less.

34 Claims, 21 Drawing Sheets

(51) Int. Cl.
*C30B 29/36* (2006.01)
*H01L 21/02* (2006.01)
*C30B 23/00* (2006.01)
*H01L 29/16* (2006.01)

(52) U.S. Cl.
CPC ...... *H01L21/0243* (2013.01); *H01L 21/02378* (2013.01); *H01L 21/02433* (2013.01); *H01L 21/02529* (2013.01); *H01L 21/02587* (2013.01); *H01L 21/02609* (2013.01); *H01L 29/1608* (2013.01); *Y10T 428/21* (2015.01)

(56) References Cited

U.S. PATENT DOCUMENTS

| 2010/0295059 | A1* | 11/2010 | Fujimoto et al. | 257/77 |
| 2012/0060751 | A1* | 3/2012 | Urakami et al. | 117/106 |
| 2012/0073495 | A1* | 3/2012 | Urakami et al. | 117/106 |
| 2012/0132132 | A1* | 5/2012 | Urakami et al. | 117/106 |

FOREIGN PATENT DOCUMENTS

| JP | 8-143396 | 6/1996 |
| JP | 2002-29897 | 1/2002 |
| JP | 2003-119097 | 4/2003 |
| JP | 2003-321298 | 11/2003 |

OTHER PUBLICATIONS

International Preliminary Report on Patentability and Written Opinion issued Dec. 27, 2013, in International application No. PCT/JP2012/064398.

Daisuke Nakamura, et al., "Ultrahigh-quality silicon carbide single crystals", Nature, vol. 430, Aug. 26, 2004, pp. 1009-1012.

Office Action issued Sep. 2, 2014, in Japanese Patent Application No. 2011-125886 with English translation.

Office Action issued May 12, 2015, in Japanese Patent Application No. 2011-125886, filed Jun. 5, 2011 (with English-language Translation).

* cited by examiner

SiC SINGLE CRYSTAL, PRODUCTION METHOD THEREFOR, SIC WAFER AND SEMICONDUCTOR DEVICE

FIELD OF THE INVENTION

The present invention relates to an SiC single crystal and a production method therefor as well as an SiC wafer and a semiconductor device. More specifically, it relates to an SiC single crystal containing few differently oriented crystalline masses or few heterogeneous polytype crystalline masses and a production method therefor as well as an SiC wafer cut out from the SiC single crystal and a semiconductor device.

BACKGROUND OF THE INVENTION

In SiC (silicon carbide), a high-temperature type (α-type) having a hexagonal crystal structure and a low-temperature type (β-type) having a cubic crystal structure are known. SiC is characterized, in comparison with Si, by having a high thermal resistance, a broadband gap, and a high dielectric breakdown electric field strength. For that reason, a semiconductor including an SiC single crystal is expected as a candidate material of a next-generation power device substituting for an Si semiconductor. In particular, α-type SiC has a band gap broader than β-type SiC and hence the α-type SiC attracts attention as a semiconductor material of an ultralow power-loss power device.

The α-type SiC has, as the principal crystal plane, a {0001} plane (to be also referred to as "c-plane" hereunder), a {1-100} plane (m-plane), and a {11-20} plane (a-plane in a narrow sense) the latter two of which are perpendicular to the {0001} plane. In the present invention, "a-plane" means a-plane in a broad sense, that is, "generic name for m-plane and a-plane in a narrow sense". When it is necessary to distinguish the m-plane from the a-plane in a narrow sense, they are referred to as "{1-100} plane" and "{11-20} plane", respectively.

A c-plane growth method has heretofore been known as a method of obtaining an α-type SiC single crystal. The "c-plane growth method" cited here means a method of using as a seed crystal an SiC single crystal in which a c-plane or a plane having an offset angle to the c-plane in a prescribed range is exposed as a growth plane and growing an SiC single crystal over the growth plane by a sublimation reprecipitation method or the like.

The problem has, however, been that, in a single crystal obtained by the c-plane growth method, a large number of defects such as micro pipe defects (tubular voids about several µm to 100 µmin diameter) and threading screw dislocation (hereunder referred to also merely as "screw dislocation") are generated in the direction parallel to the <0001> direction. To realize a high-performance SiC power device, the reduction of a leak current generated in an SiC semiconductor is essential. It is considered that defects such as micropipe defects and screw dislocation which are generated in the SiC single crystal cause an increase in this leak current.

Then, to solve this problem, various proposals have been made.

For example, Patent Document 1 discloses a growth method of an SiC single crystal for growing an SiC single crystal by using a seed crystal having a plane (for example, {1-100} plane or {11-20} plane) which is inclined at about 60° to about 120° from the c-plane and exposed as the growth plane (this growth method will be referred to as "a-plane growth method" hereinafter).

The above document teaches that:
(1) when SiC is grown on a crystal plane inclined at about 60° to 120° from the c-plane, an array of atomic layers appears on the crystal plane, thereby making it easy to grow a crystal having the same type of a polytype structure as that of the original seed crystal;
(2) when this method is employed, screw dislocation does not occur; and
(3) when the seed crystal includes dislocation having a slip plane on the c-plane, this dislocation is carried over to the growing crystal.

Patent Document 2 discloses a growth method of an SiC single crystal, including the steps of:
growing SiC by using a seed crystal having a {10-10} plane as the growth plane;
taking out a {0001} wafer from the obtained single crystal; and
growing SiC by using this wafer as a seed crystal.

The above document teaches that, by this method,
(1) an SiC single crystal having few micropipe defects is obtained; and
(2) since a much larger {0001} wafer than an Acheson crystal is obtained, it is used as a seed crystal to grow a large-sized crystal easily.

Patent Documents 3 and 4 disclose a method for producing an SiC single crystal, including the steps of:
carrying out a-plane growth in orthogonal directions a plurality of times; and
carrying out c-plane growth in the end.

The above documents teach that:
(1) as the number of repetitions of a-plane growth increases, the dislocation density in the growing crystal decreases in an exponential fashion;
(2) the generation of a stacking fault during a-plane growth cannot be avoided; and
(3) when c-plane growth is carried out in the end, micropipe defects and screw dislocation do not occur and an SiC single crystal having almost no stacking fault is obtained.

Further, Patent Document 5 discloses a growth method of an SiC single crystal in which a seed crystal with a crystal plane having an offset angle of 5° to 30° in the (000-1) C-plane direction from a plane perpendicular to the (0001) basal plane of an SiC single crystal is used in the sublimation reprecipitation method.

The above document teaches that:
(1) when a plane offset to the (000-1) C-plane direction is used, crystal grains having different crystal orientation is hardly obtained as compared with when a plane offset to the (0001) Si-plane direction is used;
(2) when a plane offset to the (000-1) C-plane direction is used, such grains are rarely produced as compared with a nonpolar plane perpendicular to the (0001) basal plane; and
(3) when the offset angle to the (000-1) C-plane direction is too large, the mixture of polytype readily occurs and a large number of crystal defects are produced.

The a-plane growth method has an advantage that an SiC single crystal having a low screw dislocation density is obtained. However, the a-plane growth method has a problem that high-density stacking faults almost parallel to the c-plane tend to be produced. When a stacking fault occurs in the SiC single crystal, electric resistance in a direction across the stacking fault increases. Therefore, an SiC single crystal having such stacking faults at a high density cannot be used as a semiconductor for power devices.

Meanwhile, it is considered that when c-plane growth is carried out after a-plane growth is carried out at least one time, an SiC single crystal having almost no screw dislocation and no stacking faults can be produced.

To manufacture a substrate having a large diameter of the {0001} plane by using a method making use of a combination of a-plane growth and c-plane growth, a crystal which is prolonged in both {11-20} plane growth direction and {1-100} plane growth direction which is inclined at 90° from that plane must be grown. However, in the {11-20} plane growth and the {1-100} plane growth, differently oriented crystals or heterogeneous polytype crystals are often produced on the growth plane.

To solve this problem, as disclosed by Patent Document 5, it is proposed to use a crystal plane having an offset angle of 5° to 30° in the (000-1) C-plane direction from a plane perpendicular to the basal plane. However, when the offset angle is small, it is impossible to completely suppress the production of differently oriented crystals. When the offset angle is large, a heterogeneous polytype layer which grows outward from the end on the C-plane side of a seed crystal expands into the growing crystal along the growth of the crystal. Therefore, the final yield when the {0001} plane substrate is cut out is reduced, and it is difficult to cut out a large-diameter substrate.

PRIOR ART DOCUMENTS

Patent Documents

[Patent Document 1] Japanese Patent Application Laid-Open No. H05-262599
[Patent Document 2] Japanese Patent Application Laid-Open No. H08-143396
[Patent Document 3] Japanese Patent Application Laid-Open No. 2003-119097
[Patent Document 4] Japanese Patent Application Laid-Open No. 2003-321298
[Patent Document 5] Japanese Patent Application Laid-Open No. 07-267795

SUMMARY OF THE INVENTION

It is an object of the present invention to provide an SiC single crystal which contains few differently oriented crystals or few heterogeneous polytype crystals and from which a substrate having a large diameter of the {0001} plane can be cut out, a production method therefor, an SiC wafer which is cut out from this SiC single crystal, and a semiconductor device.

To attain the above object, the method for producing SiC single crystal of the present invention has the following constitution:
(a) The method for producing SiC single crystal repeats an a-plane growth step n (n≥2) times.
(b) A first a-plane growth step is a step for carrying out the a-plane growth of an SiC single crystal on a first growth plane by using a first seed crystal having the first growth plane with an offset angle from the {0001} plane of 80° to 100°.
(c) A k-th a-plane growth step (2≤k≤n) is a step for cutting out a k-th seed crystal having a k-th growth plane with a growth direction 45 to 135° different from the growth direction of a (k−1)-th a-plane growth step and an offset angle from the {0001} plane of 80° to 100° from a (k−1)-th grown crystal obtained in the (k−1)-th a-plane growth step, and carrying out the a-plane growth of an SiC single crystal on the k-th growth plane.

(d) The k-th a-plane growth step (1≤k≤n) is a step for carrying out the a-plane growth of an SiC single crystal on the k-th growth plane so that an area ratio $S_{facet}$ of an Si-plane side facet region represented by the equation (A) is maintained at 20% or less:

$$S_{facet}(\%)=S_1\times 100/S_2 \quad (A)$$

where $S_1$ is the sum of the total area of areas obtained by projecting polar plane steps of Si-plane side on the k-th growth plane and the total area of areas obtained by projecting {1-100} plane facets sandwiched between polar plane steps of the Si-plane side on the k-th growth plane, and $S_2$ is the total area of the k-th growth plane.

The SiC single crystal of the present invention is obtained by the a-plane growth method of the present invention and contains no differently oriented crystalline masses or no heterogeneous polytype crystalline masses in a region excluding 20% of the region from the periphery.

The SiC wafer of the present invention is cut out from the SiC single crystal of the present invention, and its widest plane has an absolute value of offset angle from the {0001} plane of 30° or less.

Further, the semiconductor device of the present invention is manufactured by using the SiC single crystal or the SiC wafer of the present invention.

When the a-plane growth of the SiC single crystal is carried out, a region (facet region) constituted of a {1-100} plane facet, polar plane steps of an Si-plane side and polar plane steps of a C-plane side is formed.

In the case of the a-plane growth of an SiC single crystal, when a crystal plane having an offset angle from the {1-100} plane within a predetermined range is used as the growth plane, a facet region is formed almost in the center portion of the surface of the growing crystal. When a crystal plane having an offset angle from the {11-20} plane within a predetermined range is used as the growth plane, a facet region is formed at the both ends of the surface of the growing crystal. In this case, heterogeneous polytype crystals or differently oriented crystals tend to be produced mainly from a region having polar plane steps of Si-plane side (Si-plane side facet region) within the facet region.

Therefore, when the step of carrying out the a-plane growth of an SiC single crystal on the growth plane is repeated two times or more so that the area ratio $S_{facet}$ of the Si-plane side facet region represented by the equation (A) is maintained at 20% or less, a large-diameter a-plane grown crystal containing few differently oriented crystals or few heterogeneous polytype crystals can be produced.

PREFERRED EMBODIMENTS OF THE INVENTION

Preferred embodiments of the present invention will be described in detail hereinunder.
[1. Definition of Terms]
[1.1. a-Plane Growth]

The term "growth plane" means the plane of a seed crystal for growing a new single crystal composed of SiC.

The term "a-plane growth" means that a new single crystal composed of SiC is grown by using a plane having an offset angle from the {11-20} plane or {1-100} plane within a predetermined range as the growth plane.

The term "{11-20} plane growth (or <11-20> growth)" means that a new single crystal composed of SiC is grown by using a plane having an offset angle from the {11-20} plane within a predetermined range as the growth plane.

The term "{1-100} plane growth (or <1-100> growth)" means that a new single crystal composed of SiC is grown by using a plane having an offset angle from the {1-100} plane within a predetermined range as the growth plane.

The term "growth direction" means the macroscopic growth direction of an SiC single crystal, generally, a direction perpendicular to the bottom of an SiC seed crystal or the seat of a seed crystal fixing this.
[1.2. Offset Angle]

The term "offset angle from the {0001} plane" means an angle between the normal vector of the growth plane of a seed crystal and the normal vector of the {0001} plane.

The term "offset angle from the {11-20} plane" means an angle between vector b obtained by projecting the normal vector of the growth plane of a seed crystal on the {0001} plane and a <11-20> axis which forms the smallest angle with the vector b out of <11-20> axes within the {0001} plane. In this case, the term "positive offset angle" means that the vector b is in a clockwise direction with the <11-20> axis as a standard.

The term "offset angle from the {1-100} plane" means an angle between vector b' obtained by projecting the normal vector of the growth plane of a seed crystal on the {0001} plane and a <1-100> axis which forms the smallest angle with the vector b' out of <1-100> axes within the {0001} plane. In this case, the term "positive offset angle" means that the vector b' is in a clockwise direction with the <1-100> axis as a standard.

[1.3. Facet Region]

Figure 1:
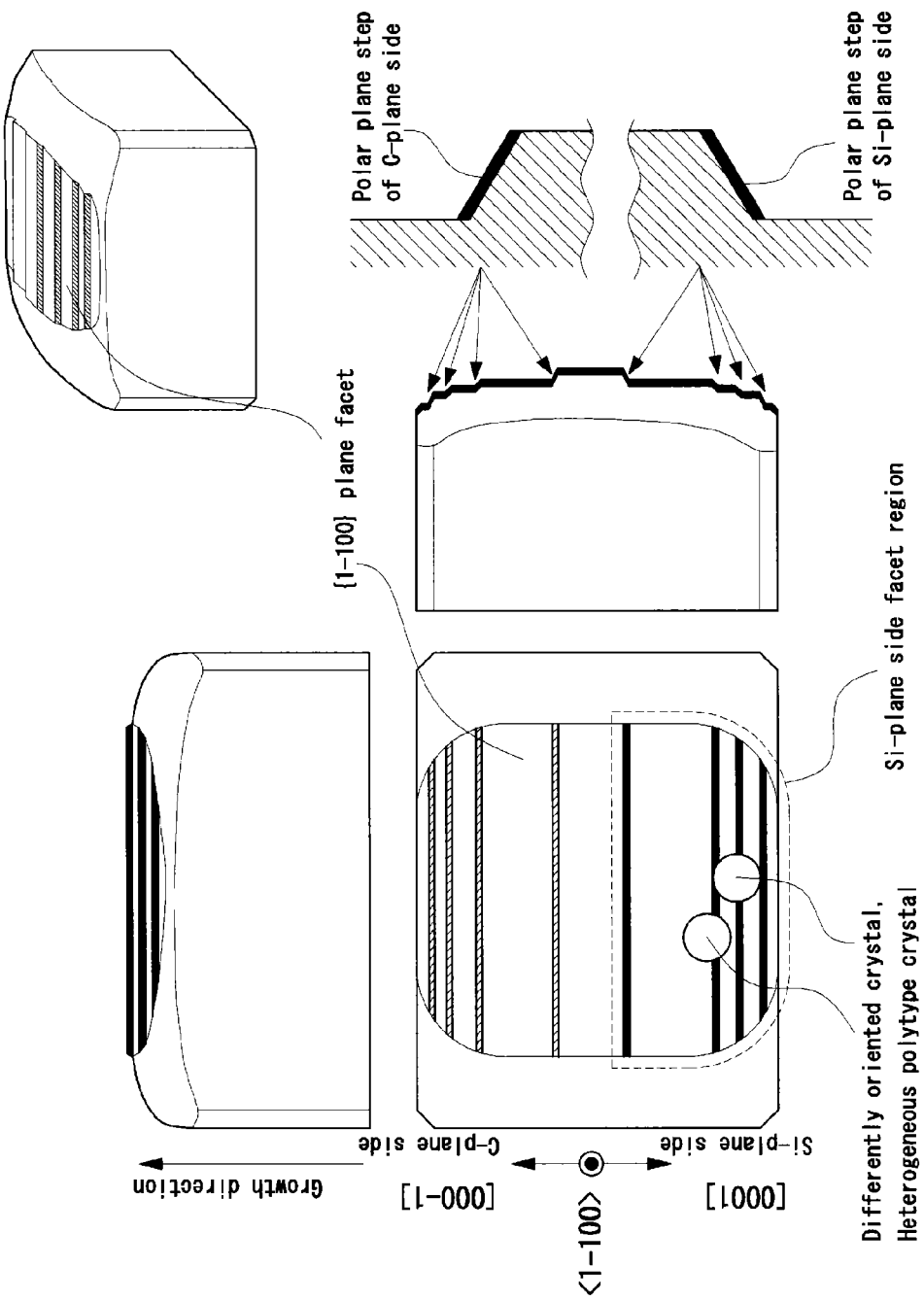
FIG. 1 are a plan view (lower left), a front view (upper left), a right side view (lower middle), a perspective view (upper right) and a partially enlarged right side view (lower right) of a grown crystal obtained by growing SiC on the {1-100} plane.

FIG. 1 show a plan view (lower left), a front view (upper left), a right side view (lower middle), a perspective view (upper right) and a partially enlarged right side view (lower right) of a grown crystal obtained by growing SiC on the {1-100} plane.

An α-type SiC single crystal has polar planes typified by {0001} plane (c-plane) and non-polar planes such as {11-20} plane and {1-100} plane. The {0001} plane is divided into a plane (C-plane) represented by (000-1) plane from which a carbon atom is exposed and a plane (Si-plane) represented by (0001) plane from which a silicon atom is exposed. Both a carbon atom and a silicon atom are exposed from the {11-20} plane and the {1-100} plane.

When SiC is grown on the a-plane, a {1-100} plane facet having the smallest surface energy appears on the surface of the growing crystal. The {1-100} plane facet appears on a surface almost perpendicular to the <1-100> axis.

Figure 2:
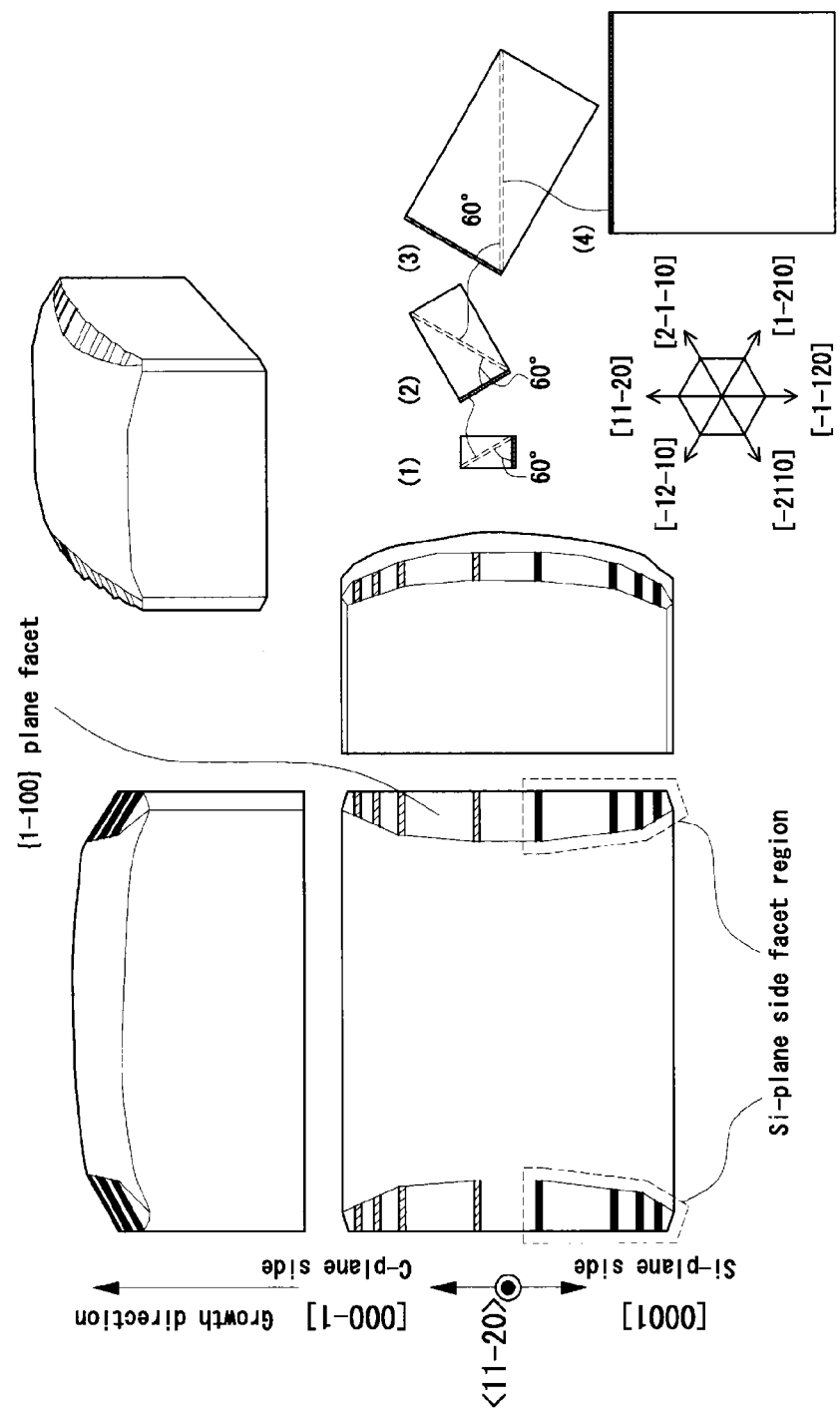
FIG. 2 are a plan view (lower left), a front view (upper left), a right side view (lower middle) and a perspective view (upper right) of a grown crystal obtained by growing SiC on the {11-20} plane and a conceptual diagram (lower right) of a {11-20} plane selective growth method.

For example, when SiC is grown on the {1-100} plane, the {1-100} plane facet appears almost at the center of the surface of the growing crystal as shown in FIG. 1. Meanwhile, when SiC is grown on the {11-20} plane, the {1-100} plane facet appears at both ends (directions inclined at 30° from the <11-20> axis) of the surface of the growing crystal as shown in FIG. 2.

The surface of the growing crystal is generally curved. This is because the surface of the growing crystal tends to befit to a curved isothermal surface. Since the {1-100} plane facet is flat, the entire curved surface in a position almost perpendicular to the <1-100> axis cannot be covered by the {1-100} plane facet. The a-plane growth is not spiral growth in which growth proceeds while steps spread in the facet in-plane direction like c-plane growth but growth in which steps extend in a direction vertical to the facet at each point in the facet. Therefore, steps are readily formed in the {1-100} plane facet unlike the {0001} plane facet. Consequently, on the curved surface of a growing crystal during a-plane growth, polar plane steps parallel to the {0001} plane are often formed between the {1-100} plane facets in addition to a plurality of flat {1-100} plane facets so as to arrange along the curve in the <0001> direction.

The normal vector of the polar plane step is not always completely parallel to the <0001> axis. It is considered that it is inclined toward the <1-100> axis direction in most cases. As for the polar plane steps formed between {1-100} plane facets, steps in the C-plane side direction and steps in the Si-plane side direction from the {1-100} plane facet at the top of the surface of the growing crystal are oriented in opposite directions.

The term "polar plane steps of C-plane side" means steps having a plane inclined toward the C-plane side (that is, a plane whose normal vector has a [000-1] direction component) out of polar plane steps formed between {1-100} plane facets.

The term "polar plane steps of Si-plane side" means steps having a plane inclined toward the Si-plane side (that is, a plane whose normal vector has a [0001] direction component) out of polar plane steps formed between {1-100} plane facets.

The term "facet region" means a region including a {1-100} plane facet, polar plane steps of C-plane side and polar plane steps of Si-plane side.

The term "Si-plane side facet region" means a region including polar plane steps of Si-plane side and {1-100} plane facets sandwiched between polar plane steps of Si-plane side within the facet region.

[2. Method for Producing SiC Single Crystal (1)]

The method for producing SiC single crystal according to a first embodiment of the present invention has the following constitution.

(a) The method for producing SiC single crystal repeats an a-plane growth step n (n≥2) times.

(b) The first a-plane growth step is a step for carrying out the a-plane growth of an SiC single crystal on a first growth plane by using a first seed crystal having the first growth plane with an offset angle from the {0001} plane of 80° to 100°.

(c) The k-th a-plane growth step (2≤k≤n) is a step for cutting out a k-th seed crystal having a k-th growth plane with a growth direction 45° to 135° different from the growth direction of a (k−1)-th a-plane growth step and an offset angle from the {0001} plane of 80° to 100° from a (k−1)-th grown crystal obtained in the (k−1)-th a-plane growth step, and carrying out the a-plane growth of an SiC single crystal on the k-th growth plane.

(d) The k-th a-plane growth step (1≤k≤n) is a step for carrying out the a-plane growth of an SiC single crystal on the k-th growth plane so that the area ratio $S_{facet}$ of an Si-plane side facet region represented by the equation (A) is maintained at 20% or less.

$$S_{facet}(\%) = S_1 \times 100 / S_2 \quad (A)$$

wherein $S_1$ is the sum of the total area of areas obtained by projecting polar plane steps of Si-plane side on the k-th growth plane and the total area of areas obtained by projecting {1-100} plane facets sandwiched between the polar plane steps of Si-plane side on the k-th growth plane, and $S_2$ is the total area of a k-th growth plane.

[2.1. a-Plane Growth Step]

The method for producing SiC single crystal according to this embodiment repeats an a-plane growth step n (n≥2) times. In the a-plane growth steps after the second one, a seed crystal cut out from a grown crystal obtained in the previous a-plane growth step is used.

The k-th seed crystal used in the k-th a-plane growth step (1≤k≤n) has a k-th growth plane having an offset angle from the {0001} plane of 80° to 100°. When the offset angle from the {0001} plane of the k-th growth plane is smaller than 80° or larger than 100°, the final yield at the time of cutting out a {0001} plane substrate lowers. The offset angle from the {0001} plane of the k-th growth plane is more preferably more than 85° to less than 95°.

The growth direction of the k-th a-plane growth step (2≤k≤n) should be in a range of 45° to 135° with respect to the growth direction of the (k−1)-th a-plane growth step as long as the area ratio $S_{facet}$ of the Si-plane side facet region is maintained at a predetermined range.

To obtain an SiC single crystal from which a large-diameter {0001} plane substrate containing few differently oriented crystals or few heterogeneous polytype crystals can be cut out, the growth direction of the k-th a-plane growth step (2≤k≤n) is preferably:

(1) a direction about 60° or about 120° different from the growth direction of the (k−1)-th a-plane growth step in which {11-20} plane growth is carried out ({11-20} plane selective growth method), or (2) a direction about 90° different from the growth direction of the (k−1)-th a-plane growth step in which {11-20} plane growth or {1-100} plane growth is carried out ({11-20} plane and {1-100} plane alternate growth method. To be simply referred to as "alternate growth method" hereinafter).

[2.2. Area Ratio $S_{facet}$ of Si-plane Side Facet Region]

Figure 18:
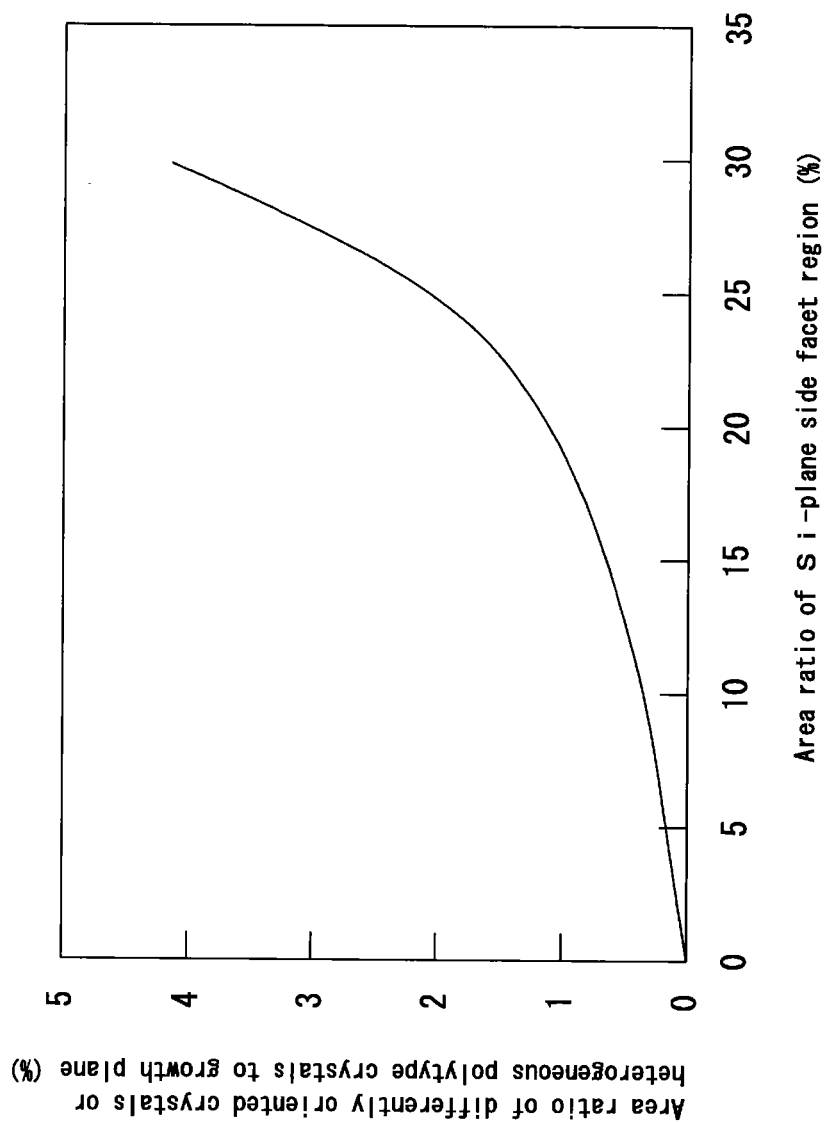
FIG. 18 is a graph showing the relationship between the area ratio of the Si-plane side facet region and the area ratio of differently oriented crystals or heterogeneous polytype crystals to the growth plane.

When an SiC single crystal is grown on the a-plane, differently oriented crystals or heterogeneous polytype crystals are often produced in the growing crystal. The inventors of the present invention have conducted a large number of growth experiments and taken statistics on the production site. As a result, it is found that the site where differently oriented crystals or heterogeneous polytype crystals are produced is in the facet region in most cases as shown in FIG. 1. It is also found that these crystals are produced mostly in the Si-plane side facet region out of the facet region. In the {1-100} plane growth shown in FIG. 1, since the shape of the growth plane is not generally controlled, the Si-plane side facet region has a large area ratio of 30 to 40%. In this case, the production probability of differently oriented crystals or heterogeneous polytype crystals is very high and the area ratio of these crystals to the growth plane significantly increases as shown in FIG. 18. Once differently oriented crystals or heterogeneous polytype crystals are produced, they may expand to the size of the Si-plane side facet region at maximum along the proceeding of growth. Therefore, this is a serious problem to be solved for the production of a large-diameter a-plane grown substrate.

Although the detailed cause of producing differently oriented crystals or heterogeneous polytype crystals is not known, the following is conceivable.

That is, as shown in FIG. 1, when SiC is grown on the a-plane, a facet region including polar plane steps is formed on the surface of the growing crystal. It is considered that when the polar plane steps are formed like this, even if the main growth plane of the crystal is in the <11-20> direction or <1-100> direction, a <0001> direction growth component is produced in the polar plane steps. When the surface of the growing crystal is perpendicular to the {0001} plane, since the crystal grows while a crystal polytype layer is exposed to the surface of the crystal, heterogeneous polytype hardly occurs.

However, in the a-plane growth, if the <0001> direction growth component is produced on the surface of the growing crystal, threading screw dislocation in <0001> direction which is a step supply source for transmitting the polytype of the crystal in the <0001> direction does not exist on the surface of the crystal. Therefore, it is considered that heterogeneous polytype is generated on polar plane steps and becomes coarse as differently oriented crystals.

Further, it is said that, in the growth of an SiC single crystal, 4H polytype SiC is hardly grown on a seed crystal from which Si-plane is exposed. It is considered that the fact that differently oriented crystals or heterogeneous polytype crystals are often produced in the Si-plane side facet region is connected with this.

In the present invention, in the k-th a-plane growth step (1≤k≤n), the a-plane growth of an SiC single crystal is carried out on the k-th growth plane so that the area ratio $S_{facet}$ of the Si-plane side facet region represented by the above equation (A) is maintained at 20% or less. Therefore, the production frequency of differently oriented crystals or heterogeneous polytype crystals and the sizes of these crystals can be significantly reduced as shown in FIG. 18. Also, since the yield is improved, a substrate having a large diameter of the {0001} plane can be cut out from the obtained grown crystal.

The production frequency of differently oriented crystals or heterogeneous polytype crystals and the degree of expansion become higher as $S_{facet}$ becomes higher. Therefore, to reduce the production frequency and prevent the expansion, the smaller the area ratio $S_{facet}$ of the Si-plane side facet region is, the better. $S_{facet}$ is more preferably 10% or less and more preferably 5% or less.

To manufacture an a-plane grown substrate having a large diameter of the {0001} plane without reducing the yield while suppressing the production of differently oriented crystals or heterogeneous polytype crystals, the substrate must be grown in at least two different directions and two-dimensional expansion must be carried out while the area ratio $S_{facet}$ of the Si-plane side facet region, which will become a generation region of differently oriented crystals or heterogeneous polytype crystals, is maintained at a small value without providing a large offset angle from the a-plane in the <0001> axial direction.

Methods to achieve such a low $S_{facet}$ value include:
(1) a method for reducing the area of the Si-plane side facet region by shrinking the formation area of the facet region itself, or
(2) a method for reducing the ratio of the Si-plane side facet region to the facet region.

The following methods are effective as specific means.

[3. Example (1) of a-Plane Growth Method: {11-20} Plane Selective Growth Method]

[3.1. Summary]

A first example for manufacturing an a-plane grown substrate having a large diameter of the {0001} plane while suppressing the production of differently oriented crystals or heterogeneous polytype crystals is a {11-20} plane selective growth method.

The {11-20} plane selective growth method is a method in which a-plane growth is repeated in directions about 60° or about 120° different from the {11-20} plane as a standard.

That is, the {11-20} plane selective growth method is a method in which the first a-plane growth step is a step for growing the SiC single crystal on the {11-20} plane by using a first seed crystal having a first growth plane with an offset angle ($\theta_1$) from the {11-20} plane of −15° to 15°, and the k-th a-plane growth step (2≤k≤n) is a step for cutting out a k-th seed crystal having a k-th growth plane with a growth direction about 60° or about 120° different from the growth direction of a (k−1)-th a-plane growth step and an offset angle ($\theta_k$) from the {11-20} plane of −15° to 15° from a (k−1)-th grown crystal obtained in the (k−1)-th a-plane growth step, and growing the SiC single crystal on the {11-20} plane by using the k-th seed crystal.

By repeating this growth, k-th seed crystals having a larger length in the {0001} plane direction are produced to increase the diameter.

FIG. 2 show a plan view (lower left), a front view (upper left), a right side view (lower middle) and a perspective view (upper right) of a grown crystal obtained by growing SiC on the {11-20} plane and a conceptual diagram (lower right) of the {11-20} plane selective growth method.

When an SiC single crystal is grown on the {11-20} plane, as shown in the lower left diagram of FIG. 2, the facet region appears at both ends of the surface of the grown crystal (that is, directions inclined at 30° with respect to the <11-20> axis). In addition, the formation area of the facet region itself is greatly reduced as compared with the {1-100} plane growth. As a result, the area of the Si-plane side facet region becomes small in accordance with this, and the SiC single crystal can be grown while maintaining $S_{facet}$ at 20% or less. In addition, since the Si-plane side facet region is formed at the ends of the grown crystal, the probability of producing differently oriented crystals or heterogeneous polytype crystals at the center of the grown crystal is extremely low. Further, in general, the growing crystal is often growing while expanding as compared with a seed crystal. However, in the {11-20} plane growth, a facet region is often formed in the expansion part of the growing crystal. In this case, the production of differently oriented crystals or heterogeneous polytype crystals in the growing crystal right above the seed crystal can be almost completely suppressed.

Therefore, as shown in the lower right diagram of FIG. 2, when the {11-20} plane growth is repeated selectively, an a-plane grown substrate having a large diameter of the {0001} plane can be manufactured without fail while the production of differently oriented crystals or heterogeneous polytype crystals is suppressed.

[3.2. Offset Angle $\theta_k$]

In the k-th a-plane growth step (1≤k≤n), the offset angle $\theta_k$ from the {11-20} plane of the k-th growth plane should be −15° to 15°. When the absolute value of $\theta_k$ is larger than 15°, the growth direction becomes close to the <1-100> direction, whereby the formation area of the facet region is expanded. Thereby, the probability of producing differently oriented crystals or heterogeneous polytype crystals at the center of the grown crystal becomes high.

The offset angle $\theta_k$ may be zero. However, in the {11-20} plane selective growth method, the number of repetitions required for the manufacture of an a-plane grown substrate having a predetermined diameter of the {0001} plane is larger than that of the alternate growth method. Therefore, it is preferred to select the optimum offset angle $\theta_k$ so that an a-plane grown substrate having a large diameter of the {0001} plane is obtained with a small number of repetitions. To this end, the offset angle $\theta_k$ of the k-th growth plane and the offset angle $\theta_{k+1}$ (1≤k≤n−1) of the (k+1) -th growth plane have opposite signs and their rotation directions are preferably directions for increasing the length $L_{k+1}$ in the {0001} plane direction of the (k+1) -th growth plane of the (k+1) -th seed crystal. The number of repetitions can be greatly reduced by slightly increasing $\theta_k$ and $\theta_{k+1}$.

The absolute value of $\theta_k$ does not always need to be the same as the absolute value of $\theta_{k-1}$. However, when $|\theta_{k-1}|=|\theta_k|$ (2≤k≤n), one of the offset angles does not become extremely large. As a result, the {1-100} plane facet is hardly expanded, and it is possible to further suppress the production of differently oriented crystals or heterogeneous polytype crystals.

To manufacture an a-plane grown substrate having a large diameter of the {0001} plane efficiently, the k-th a-plane growth step (1≤k≤n−1) is preferably a step for carrying out the {11-20} plane growth of the SiC on the k-th growth plane so as to establish the relationship of the following expression (1).

$$H_k > L_k \sin(60°+|\theta_k|+|\theta_{k+1}|) \quad (1)$$

where $H_k$ is the growth height in the k-th a-plane growth step, $L_k$ is the length in the {0001} plane direction of the k-th growth plane of the k-th seed crystal, and $\theta_k$ and $\theta_{k+1}$ have opposite signs and their rotation directions are directions for increasing the length $L_{k+1}$ in the {0001} plane direction of the (k+1)-th growth plane of the (k+1)-th seed crystal.

The k-th a-plane growth step (2≤k≤n) is preferably a step for cutting out a k-th seed crystal having the relationship of the following expression (2) from the (k−1)-th grown crystal, and carrying out the {11-20} plane growth of the SiC single crystal on the k-th growth plane.

$$L_k \approx H_{k-1}/\cos(30°-|\theta_{k-1}|-|\theta_k|) \quad (2)$$

where $H_{k-1}$ is the growth height in the (k−1)-th a-plane growth step, $L_k$ is the length in the {0001} plane direction of the k-th growth plane of the k-th seed crystal, and $\theta_{k-1}$ and $\theta_k$ have opposite signs and their rotate directions are directions for increasing $L_k$.

Here, the expression (1) shows that the SiC single crystal is grown to at least a height $H_k$ required for obtaining a (k+1)-th seed crystal having larger length $L_{k+1}$ in the {0001} plane direction than $L_k$.

The expression (2) shows that the k-th seed crystal having $L_k$ which is almost equal to the right side of the expression (2) is cut out from the obtained (k−1)-th grown crystal. In the expression (2), "≈" means that $L_k$ does not always need to be completely equal to the right side of the expression (2) and that there may be errors produced by various causes when the k-th seed crystal is cut out (for example, chamfering of the periphery of the k-th seed crystal and angular errors when the seed crystal is cut out).

A k-th seed crystal having $L_k$ which is larger than $L_{k-1}$ and smaller than the right side of the expression (2) may be cut out from the (k−1)-th grown crystal.

The expressions (1) and (2) are not always satisfied at the same time. However, when the cutting out of the seed crystal and the growth of a crystal are carried out to satisfy the expressions (1) and (2) at the same time, an a-plane grown substrate having a relatively large diameter of the {0001} plane can be manufactured with a small number of repetitions.

To manufacture the a-plane grown substrate having a large diameter of the {0001} plane more efficiently, the k-th a-plane growth step (1≤k≤n−1) is preferably a step for carrying out the {11-20} plane growth of the SiC single crystal on the k-th growth plane so that the following expression (3) is satisfied.

$$H_k L_k \tan(60°+|\theta_k|+|\theta_{k+1}|) \quad (3)$$

where $H_k$ is the growth height in the k-th a-plane growth step, $L_k$ is the length in the {0001} plane direction of the k-th growth plane of the k-th seed crystal, and $\theta_{k-1}$ and $\theta_k$ have opposite signs and their rotation directions are directions for increasing the length $L_{k+1}$ in the {0001} plane direction of the (k+1)-th growth plane of the (k+1) seed crystal.

The k-th a-plane growth step (2≤k≤n) is preferably a step for cutting out the k-th seed crystal from the (k−1)-th grown crystal so that the following expression (4) is satisfied, and carrying out the {11-20} plane growth of the SiC single crystal on the k-th growth plane.

$$L_k \approx L_{k-1}/\sin(30°-|\theta_{k-1}|-|\theta_k|) \quad (4)$$

where $L_{k-1}$ is the length in the {0001} plane direction of the (k−1)-th growth plane of the (k−1)-th seed crystal, $L_k$ is the length in the {0001} plane direction of the k-th growth plane of the k-th seed crystal, and $\theta_{k-1}$ and $\theta_k$ have opposite signs and their rotation directions are directions for increasing $L_k$.

Here, the expression (3) shows that the SiC single crystal is grown to at least a growth height $H_k$ required for cutting out the (k+1)-th seed crystal having maximum $L_{k+1}$ from the k-th grown crystal.

The expression (4) shows that the k-th seed crystal having maximum $L_k$ is cut out from the obtained (k−1)-th grown crystal. In the expression (4), "≈" means that $L_k$ does not always need to be completely equal to the theoretical maximum value and that there may be errors produced by various causes when the k-th seed crystal is cut out (for example, chamfering of the periphery of the k-th seed crystal and angular errors when the seed crystal is cut out).

The k-th seed crystal having $L_k$ which is larger than $L_{k-1}$ and smaller than the right side of the expression (4) may be cut out from the (k−1)-th grown crystal.

The expression (3) and the expression (4) do not always need to be satisfied at the same time. However, when the cutting out of the seed crystal and the growth of a crystal are carried out to satisfy the expressions (3) and (4) at the same time, an a-plane grown substrate having a relatively large diameter of the {0001} plane can be manufactured with a small number of repetitions. The a-plane growth method making use of the expression (3) and the expression (4) has an advantage that an a-plane grown substrate having a larger diameter of the {0001} plane can be manufactured with a smaller number of repetitions than that of the a-plane growth method making use of the expression (1) and the expression (2).

[3.3. Examples of Expansion of Diameter of {0001} Plane]

A specific method for expanding the diameter of the plane by using the {11-20} plane selective growth method will be described in detail hereinunder.

[3.3.1. Expansion of Diameter of {0001} Plane Only by <11-20> Onset-Growth (1)]

Figure 3:
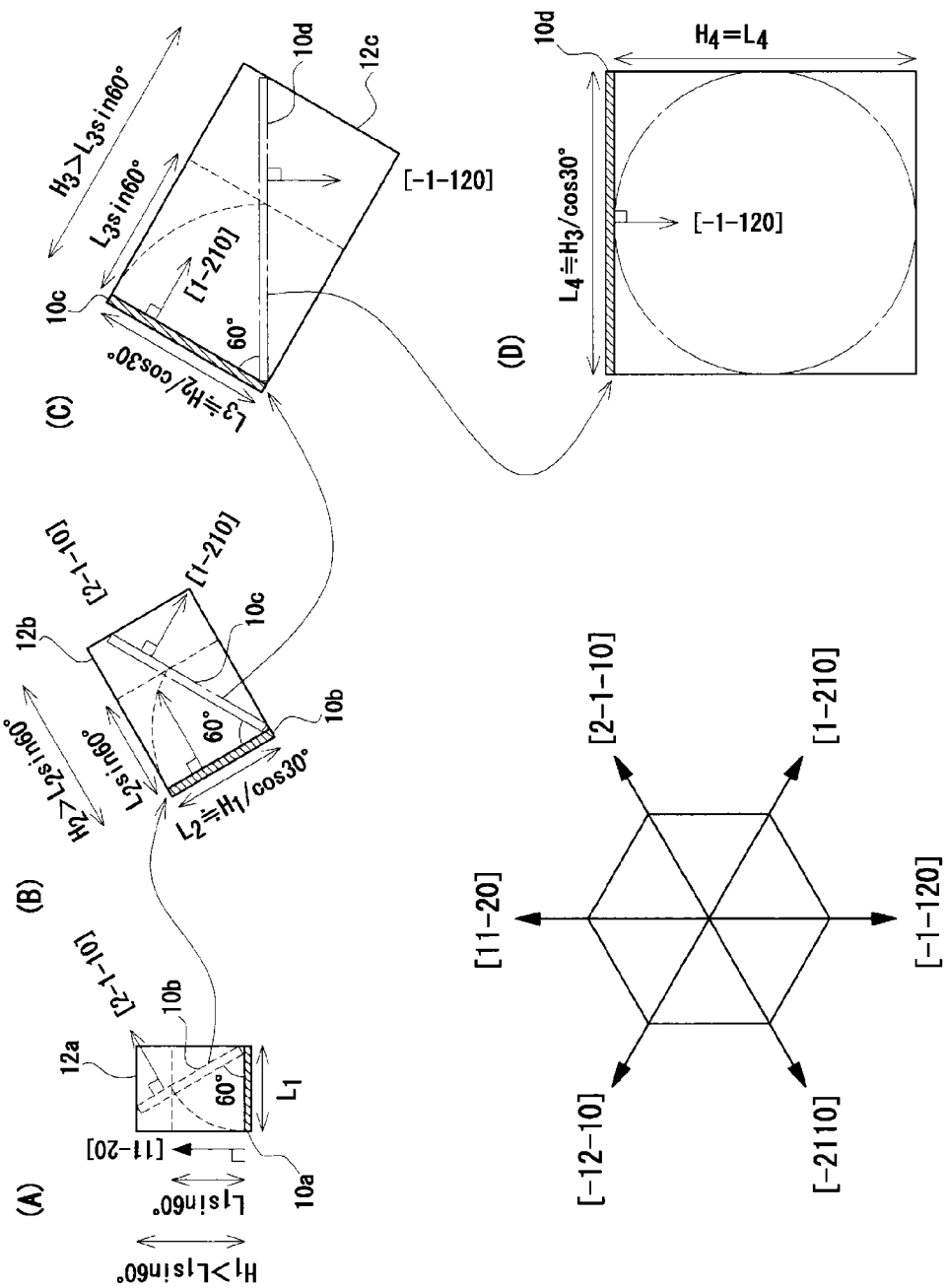
FIGS. 3A to 3D are schematic diagrams for explaining a method for expanding the diameter of the {0001} plane only by <11-20> onset-growth ($L_k$<theoretical maximum value)

A first example is a method for expanding the diameter of the {0001} plane only by <11-20> onset-growth in which the cutting out a seed crystal with a size smaller than the size that can be theoretically taken out and the growth on {11-20} plane of the seed crystal are repeated. The term "<11-20> onset-growth" means {11-20} plane growth using a seed crystal having $\theta_k$=0. FIG. 3 show schematic diagrams of a method for expanding the diameter of the {0001} plane only by <11-20> onset-growth ($L_k$<theoretically maximum value).

As shown in FIG. 3A, a first seed crystal 10a whose first growth plane is a (11-20) plane and whose length in the {0001} plane direction of the first growth plane is $L_1$ is first prepared. The history of an SiC single crystal from which the first seed crystal 10a is cut out is not particularly limited and SiC single crystals having various histories may be used.

Then, an SiC single crystal is grown on the first growth plane by using this first seed crystal 10a. At this point, an SiC single crystal is grown until $H_1 > L_1 \sin 60°$. The SiC single crystal growth method is not particularly limited and a known method (for example, a sublimation reprecipitation method) may be used. A second seed crystal 10b whose second growth plane is (2-1-10) plane and whose length in the {0001} plane direction of the second growth plane is $L_2$ ($\approx H_1/\cos 30°$) is cut out from the obtained first grown crystal 12a.

Then, as shown in FIG. 3B, an SiC single crystal is grown on the second growth plane until $H_2 > L_2 \sin 60°$ by using the second seed crystal 10b. A third seed crystal 10c whose third growth plane is a (1-210) plane and whose length in the {0001} plane direction of the third growth plane is $L_3$ ($\approx H_2/\cos 30°$) is cut out from the obtained second grown crystal 12b.

Then, as shown in FIG. 3C, an SiC single crystal is grown on the third growth plane until $H_3 > L_3 \sin 60°$ by using the third seed crystal 10c. A fourth seed crystal 10d whose fourth growth plane is a (-1-120) plane and whose length in the {0001} plane direction of the fourth growth plane is $L_4$ ($\approx H_3/\cos 30°$) is cut out from the obtained third grown crystal 12c.

Finally, as shown in FIG. 3D, an SiC single crystal is grown on the fourth growth plane until $H_4 = L_4$ by using the fourth seed crystal 10d. Thereby, an a-plane grown substrate having a diameter of the {0001} plane which is about $L_4$ is obtained.

As described above, the diameter of the {0001} plane expands every time <11-20> onset-growth is repeated. In addition, the Si-plane side facet region is always formed at the ends of the grown crystal. Therefore, an a-plane grown substrate having a large diameter of the {0001} plane can be manufactured while the production of differently oriented crystals or heterogeneous polytype crystals is suppressed.

In the example shown in FIG. 3, {11-20} plane growth is carried out four times in total. The number of repetitions of the {11-20} plane growth is not limited to four and the optimum number of repetitions can be selected according to the required diameter of the {0001} plane.

[3.3.2. Expansion of Diameter of {0001} Plane Only by <11-20> Onset-Growth (2)]

Figure 4:
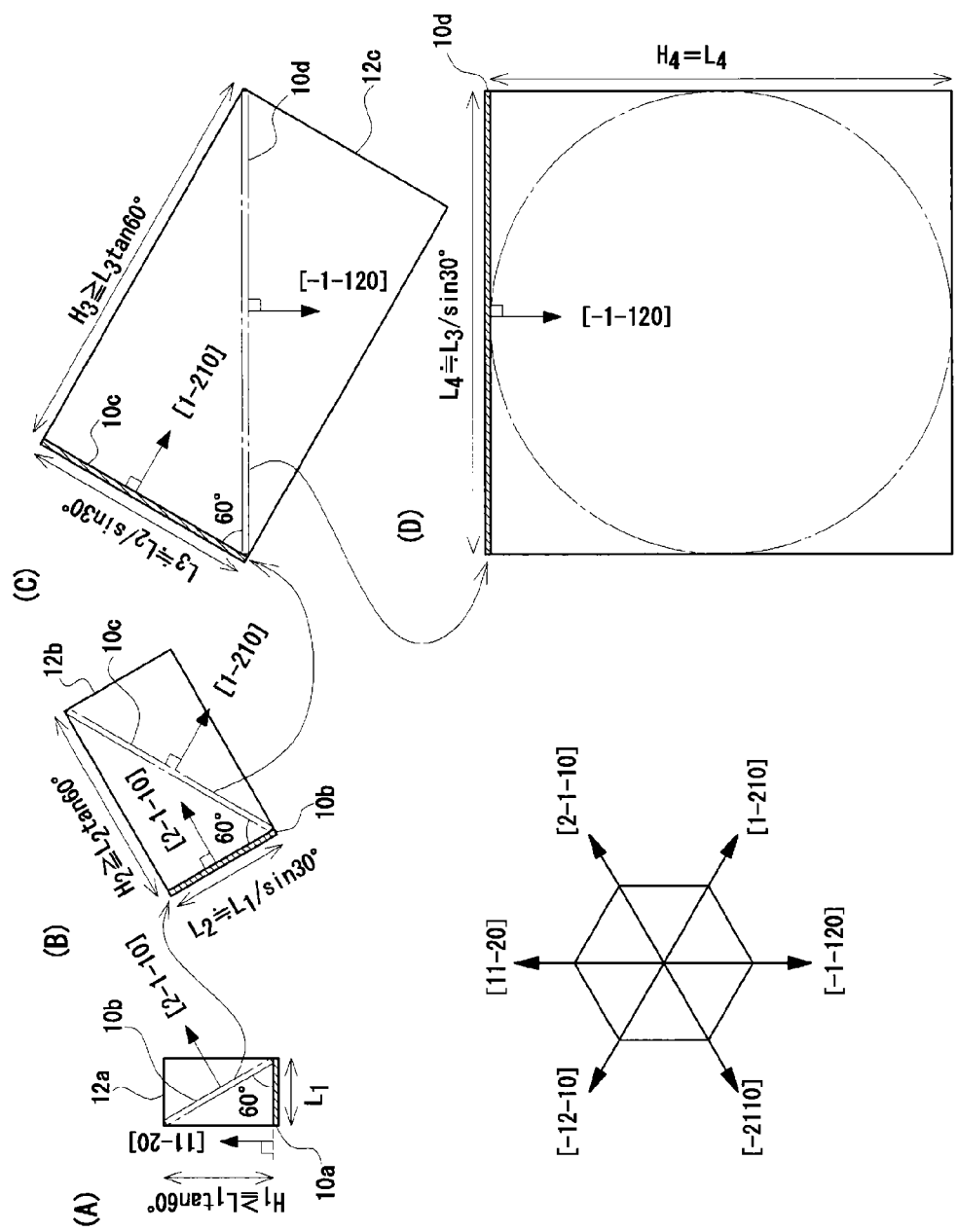
FIGS. 4A to 4D are schematic diagrams for explaining a method for expanding the diameter of the {0001} plane only by <11-20> onset-growth ($L_k$≈theoretical maximum value)

A second example is a method for expanding the diameter of the {0001} plane only by <11-20> onset-growth in which the cutting out a seed crystal with the largest size that can be theoretically taken out and the growth on {11-20} plane of the seed crystal are repeated. FIG. 4 show schematic diagrams of a method for expanding the diameter of the {0001} plane only by <11-20> onset-growth ($L_k \approx$ theoretically maximum value).

As shown in FIG. 4A, a first seed crystal 10a whose first growth plane is a (11-20) plane and whose length in the {0001} plane direction of the first growth plane is $L_1$ is first prepared. The history of an SiC single crystal from which the first seed crystal 10a is cut out is not particularly limited and SiC single crystals having various histories may be used.

Then, an SiC single crystal is grown on the first growth plane by using this first seed crystal 10a. At this point, an SiC single crystal is grown until $H_1 \geq L_1 \tan 60°$. The SiC single crystal growth method is not particularly limited and a known method (for example, the sublimation reprecipitation method) may be used. A second seed crystal 10b whose second growth plane is a (2-1-10) plane and whose length in the {0001} plane direction of the second growth plane is $L_2$ ($\approx L_1/\sin 30°$) is cut out from the obtained first grown crystal 12a.

Then, as shown in FIG. 4B, an SiC single crystal is grown on the second growth plane until $H_2 \geq L_2 \tan 60°$ by using the second seed crystal 10b. A third seed crystal 10c whose third growth plane is a (1-210) plane and whose length in the {0001} plane direction of the third growth plane is $L_3$ ($\approx L_2/\sin 30°$) is cut out from the obtained second grown crystal 12b.

Then, as shown in FIG. 4C, an SiC single crystal is grown on the third growth plane until $H_3 \geq L_3 \tan 60°$ by using the third seed crystal 10c. A fourth seed crystal 10d whose fourth growth plane is a (-1-120) plane and whose length in the {0001} plane direction of the fourth growth plane is $L_4$ ($\approx L_3/\sin 30°$) is cut out from the obtained third grown crystal 12c.

Finally, as shown in FIG. 4D, an SiC single crystal is grown on the fourth growth plane until $H_4 = L_4$ by using the fourth seed crystal 10d. Thereby, an a-plane grown substrate having a diameter of the {0001} plane which is about $L_4$ is obtained.

As described above, the diameter of the {0001} plane expands every time <11-20> onset-growth is repeated. In addition, the Si-plane side facet region is always formed at the ends of the grown crystal. Therefore, an a-plane grown substrate having a large diameter of the {0001} plane can be manufactured while the production of differently oriented crystals or heterogeneous polytype crystals is suppressed. When an SiC single crystal is grown until $L_k$ becomes the theoretically largest value, an a-plane grown substrate having a large diameter of the {0001} plane can be manufactured with a smaller number of repetitions.

In the example shown in FIG. 4, {11-20} plane growth is carried out four times in total. The number of repetitions of the {11-20} plane growth is not limited to four and the optimum number of repetitions can be selected according to the required diameter of the {0001} plane.

[3.3.3. Expansion of Diameter of {0001} Plane by <11-20> Offset-Growth (3)]

Figure 5:
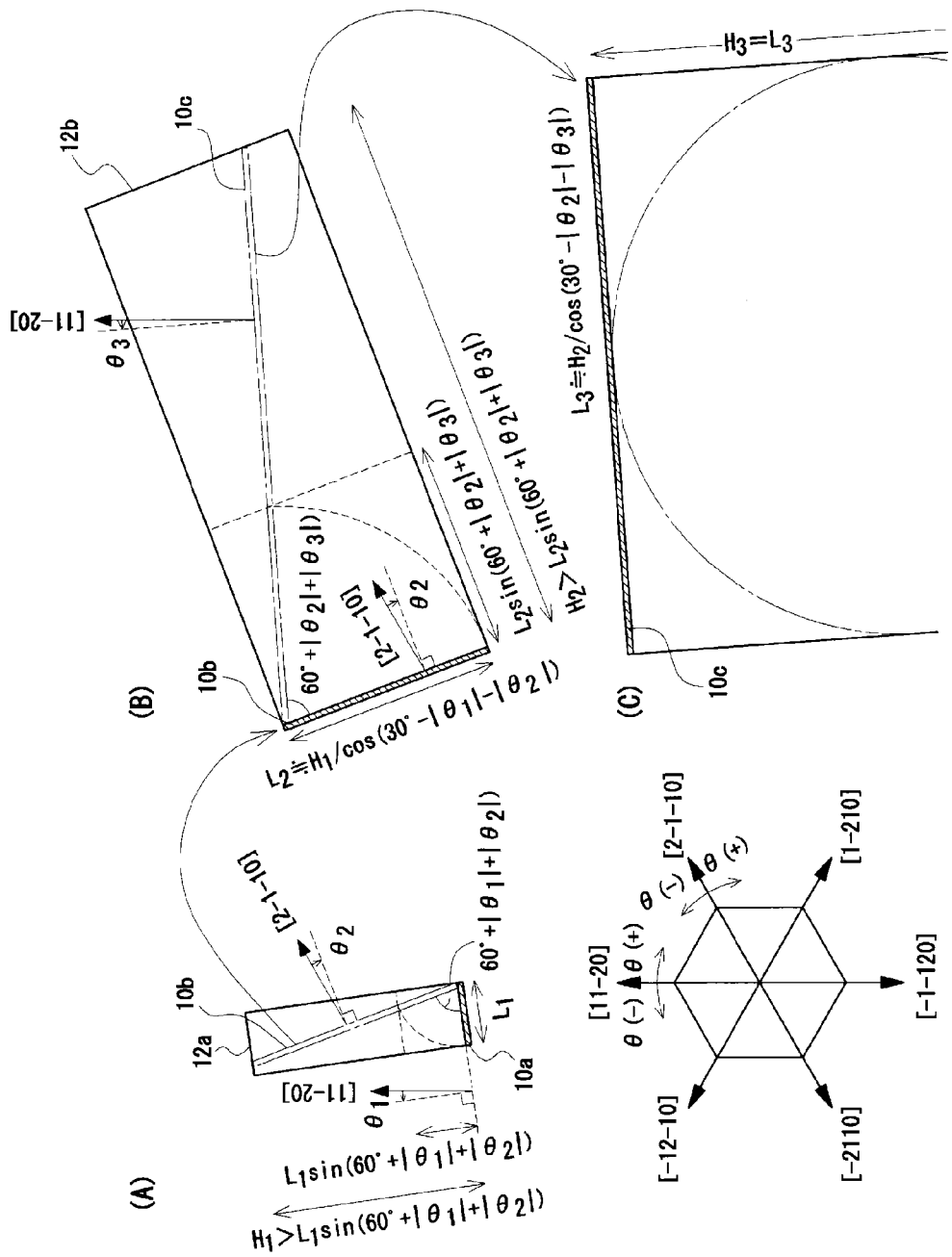
FIGS. 5A to 5C are schematic diagrams for explaining a method for expanding the diameter of the {0001} plane by <11-20> offset-growth ($L_k$<theoretical maximum value)

A third example is a method for expanding the diameter of the {0001} plane by <11-20> offset-growth in which the cutting out a seed crystal with a size smaller than the size that can be theoretically taken out and the growth on {11-20} plane of the seed crystal are repeated. The term "<11-20> offset-growth" means {11-20} plane growth using a seed crystal which satisfies $\theta_k \neq 0$. FIG. 5 show schematic diagrams of a method for expanding the diameter of the {0001} plane by <11-20> offset-growth ($L_k$<theoretically maximum value).

As shown in FIG. 5A, a first seed crystal 10a whose growth direction is a [11-20] direction, whose first growth plane has an offset angle of $\theta_1$ and whose length in the {0001} plane direction of the first growth plane is $L_1$ is first prepared. The history of an SiC single crystal from which the first seed crystal 10a is cut out is not particularly limited and SiC single crystals having various histories may be used.

Then, an SiC single crystal is grown on the first growth plane by using this first seed crystal 10a. At this point, an SiC single crystal is grown until $H_1 > L_1 \sin(60°+|\theta_1|+|\theta_2|)$. The SiC single crystal growth method is not particularly limited and a known method (for example, the sublimation reprecipitation method) may be used. A second seed crystal 10b whose growth direction is [2-1-10] direction, whose second growth plane has an offset angle of $\theta_2$ and whose length in the {0001} plane direction of the second growth plane is $L_2$ ($\approx H_1/\cos(30°-|\theta_1|-|\theta_2|)$) is cut out from the obtained first grown crystal 12a. In this case, $\theta_1$ and $\theta_2$ have opposite signs and their rotation directions are selected so as to increase $L_2$.

Then, as shown in FIG. 5B, an SiC single crystal is grown on the second growth plane until $H_2 > L_2 \sin(60°+|\theta_2|+|\theta_3|)$ by using the second seed crystal 10b. A third seed crystal 10c whose growth direction is [11-20] direction, whose third growth plane has an offset angle of $\theta_3$ and whose length in the {0001} plane direction of the third growth plane is $L_3$ ($\approx H_2/\cos(30°-|\theta_2|-|\theta_3|)$) is cut out from the obtained second grown crystal 12b. In this case, $\theta_2$ and $\theta_3$ have opposite signs and their rotation directions are selected so as to increase $L_3$.

Finally, as shown in FIG. 5C, an SiC single crystal is grown on the third growth plane until $H_3 = L_3$ by using the third seed crystal 10c. Thereby, an a-plane grown substrate having a diameter of the {0001} plane which is about $L_3$ is obtained.

As described above, the diameter of the {0001} plane expands every time <11-20> offset-growth is repeated. In addition, the Si-plane side facet region is always formed at the ends of the grown crystal. Therefore, an a-plane grown substrate having a large diameter of the {0001} plane can be manufactured while the production of differently oriented crystals or heterogeneous polytype crystals is suppressed. An a-plane grown substrate having a larger diameter of the {0001} plane can be manufactured with a smaller number of repetitions of offset-growth than the number of repetitions of onset-growth.

In the example shown in FIG. 5, {11-20} plane growth is carried out three times in total. The number of repetitions of the {11-20} plane growth is not limited to three and the optimum number of repetitions can be selected according to the required diameter of the {0001} plane.

[3.3.4. Expansion of Diameter of {0001} Plane by <11-20> Offset-Growth (4)]

Figure 6:
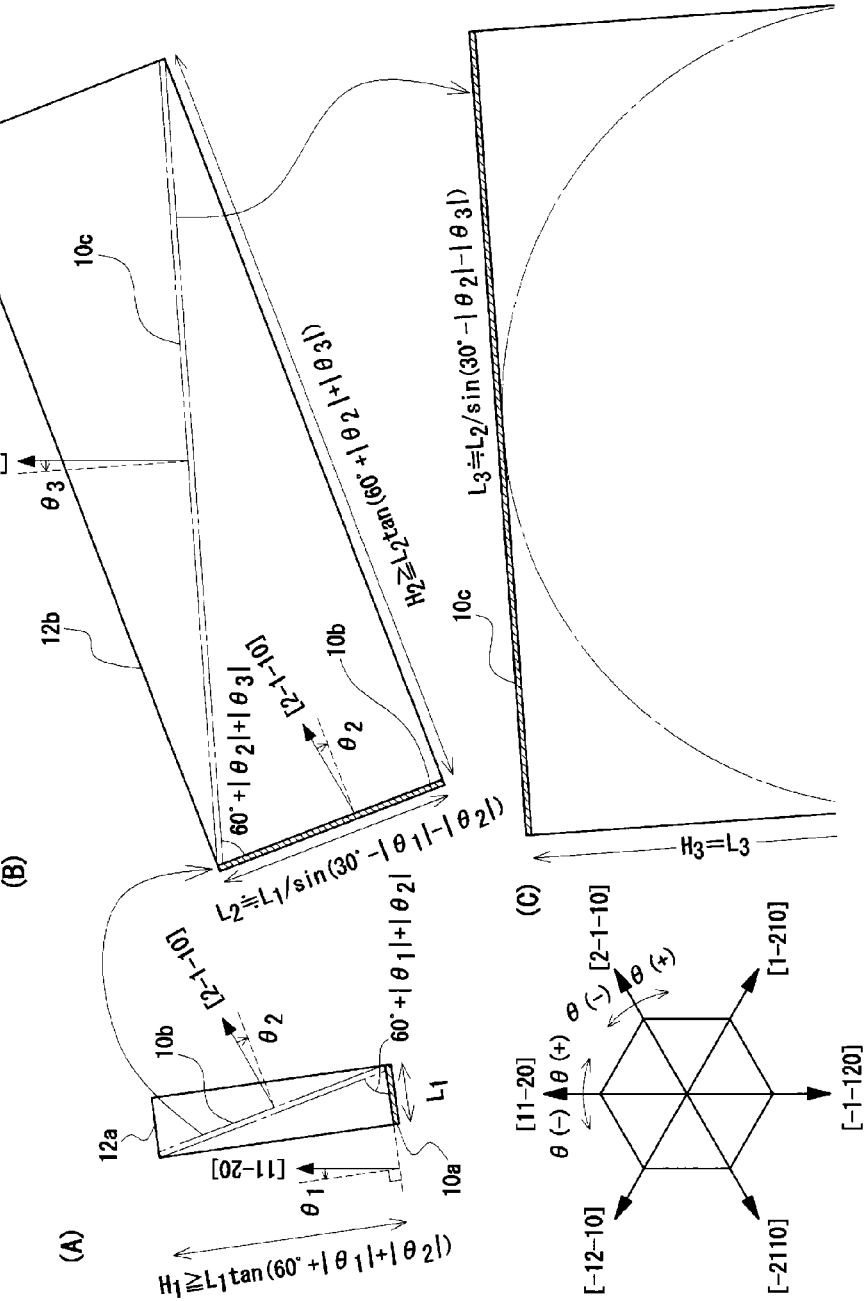
FIGS. 6A to 6C are schematic diagrams for explaining a method for expanding the diameter of the {0001} plane by <11-20> offset-growth ($L_k$≈theoretical maximum value)

A fourth example is a method for expanding the diameter of the {0001} plane by <11-20> off-growth in which the cutting out a seed crystal with the largest size that can be theoretically taken out and the growth on {11-20} plane of the seed crystal are repeated. FIG. 6 show schematic diagrams of a method for expanding the diameter of the {0001} plane by <11-20> offset-growth ($L_k \approx$ theoretically maximum value).

As shown in FIG. 6A, a first seed crystal 10a whose growth direction is [11-20] direction, whose first growth plane has an offset angle of $\theta_1$ and whose length in the {0001} plane direction of the first growth plane is $L_1$ is first prepared. The history of an SiC single crystal from which the first seed crystal 10a is cut out is not particularly limited and SiC single crystals having various histories may be used.

Then, an SiC single crystal is grown on the first growth plane by using this first seed crystal 10a. At this point, an SiC single crystal is grown until $H_1 \geq L_1 \tan(60°+|\theta_1|+|\theta_2|)$. The SiC single crystal growth method is not particularly limited and a known method (for example, the sublimation reprecipitation method) may be used. A second seed crystal 10b whose growth direction is a [2-1-10] direction, whose second growth plane has an offset angle of $\theta_2$ and whose length in the {0001} plane direction of the second growth plane is $L_2$ ($\approx L_1/\sin(30°-|\theta_1|-|\theta_2|)$) is cut out from the obtained first grown crystal 12a. In this case, $\theta_1$ and $\theta_2$ have opposite signs and their rotation directions are selected so as to increase $L_2$.

Then, as shown in FIG. 6B, an SiC single crystal is grown on the second growth plane until $H_2 \geq L_2 \tan(60°+|\theta_2|+|\theta_3|)$ by using the second seed crystal 10b. A third seed crystal 10c whose growth direction is a [11-20] direction, whose third growth plane has an offset angle of $\theta_3$ and whose length in the {0001} plane direction of the third growth plane is $L_3$ ($\approx L_2/\sin(30°-|\theta_2|-|\theta_3|)$) is cut out from the obtained second grown crystal 12b. In this case, $\theta_2$ and $\theta_3$ have opposite signs and their rotation directions are selected so as to increase $L_3$.

Finally, as shown in FIG. 6C, an SiC single crystal is grown on the third growth plane until $H_3 = L_3$ by using the third seed crystal 10c. Thereby, an a-plane grown substrate having a diameter of the {0001} plane which is about $L_3$ is obtained.

As described above, the diameter of the {0001} plane expands every time <11-20> offset-growth is repeated. In addition, the Si-plane side facet region is always formed at the ends of the grown crystal. Therefore, an a-plane grown substrate having a large diameter of the {0001} plane can be manufactured while the production of differently oriented crystals or heterogeneous polytype crystals is suppressed. When the offset-growth of an SiC single crystal is carried out until $L_k$ becomes the theoretically maximum value, an a-plane grown substrate having a larger diameter of the {0001} plane can be manufactured with a smaller number of repetitions.

In the example shown in FIG. 6, {11-20} plane growth is carried out three times in total. The number of repetitions of the {11-20} plane growth is not limited to three and the optimum number of repetitions can be selected according to the required diameter of the {0001} plane.

[3.3.5. Expansion of Diameter of {0001} Plane by <11-20> Onset-Growth or <11-20> Offset-Growth: Growth Crystal Residual Method (5)]

A fifth example is a method for expanding the diameter of the {0001} plane by <11-20> onset-growth or <11-20> offset-growth in which most of the grown crystal is directly used as a seed crystal (growth crystal residual method).

Specifically, the growth crystal residual method is a method in which the k-th a-plane growth step ($2 \leq k \leq n$) is a step for cutting the (k−1)-th grown crystal obtained in the (k−1)-th a-plane growth step along the k-th growth plane which has a growth direction about 60° or about 120° different from the growth direction of the (k−1)-th a-plane growth step and an offset angle $\theta_k$ from the {11-20} plane of −15° to 15° so that most of the (k−1)-th grown crystal remains, and carrying out the {11-20} plane growth of the SiC single crystal by using the (k−1)-th grown crystal from which the k-th growth plane is exposed as the k-th seed crystal.

Figure 7:
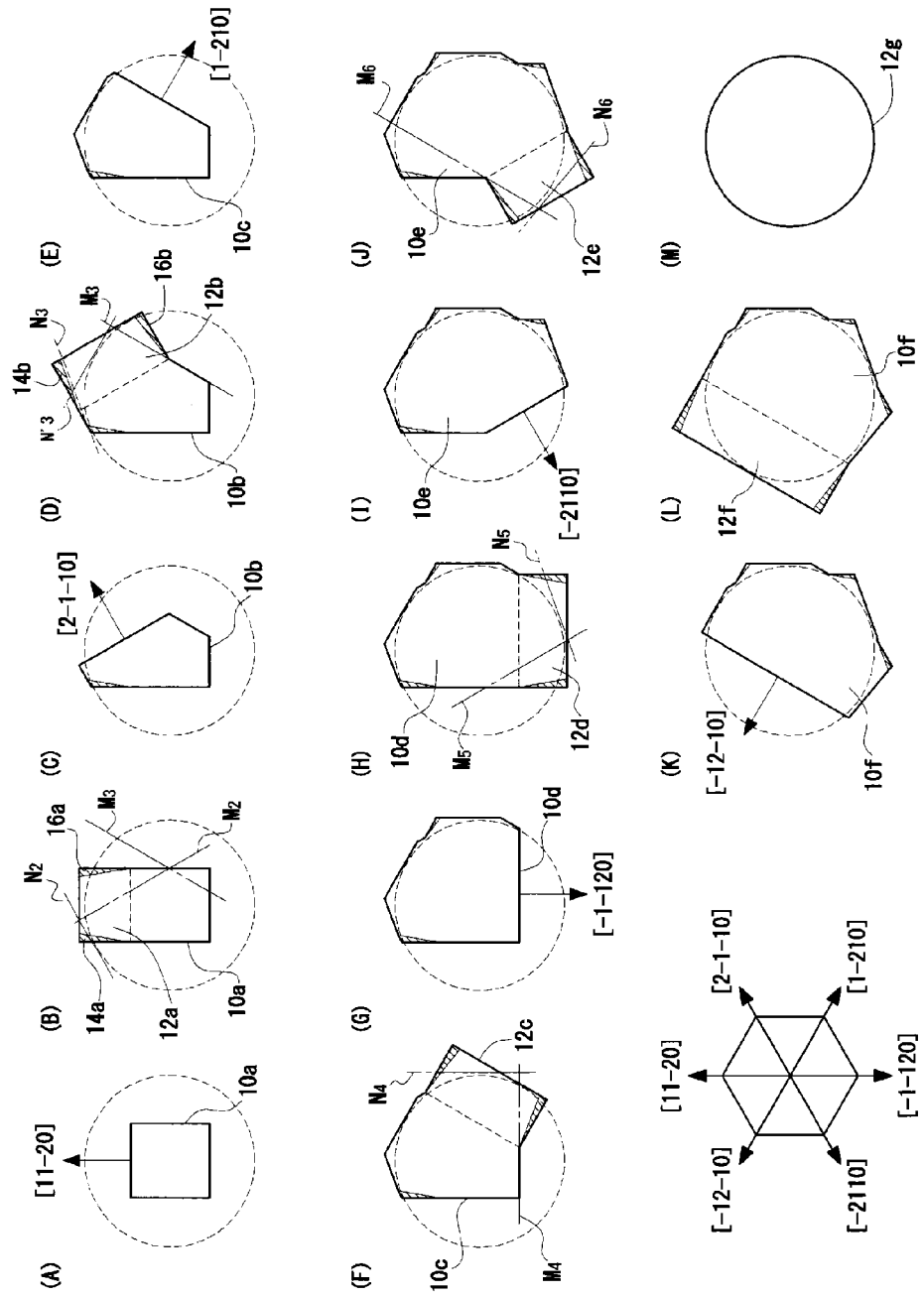
FIGS. 7A to 7M are process diagrams for explaining a grown crystal residual method which is a type of {11-20} plane selective growth method.

FIG. 7 show process diagrams of the growth crystal residual method which is a type of {11-20} plane selective growth method.

As shown in FIG. 7A, a first seed crystal 10a is first prepared. The first seed crystal 10a should have a first growth plane with an offset angle $\theta_1$ from the {11-20} plane of −15 to 15°. In the example shown in FIG. 7A, the first seed crystal 10a is an onset substrate having $\theta_1$=0. Also, the first seed crystal 10a may be a substrate thinly sliced from an ingot so that the first growth plane is exposed, or an ingot whose surface has been processed such that the first growth plane is exposed.

This first seed crystal 10a is used to grow an SiC single crystal on the {11-20} plane in the [11-20] direction (first a-plane growth step). Thereby, as shown in FIG. 7B, a first grown crystal 12a is obtained. In this case, differently oriented crystals or heterogeneous polytype crystals 14a and 16a may be grown at both ends of the first grown crystal 12a, respectively.

Then, as shown in FIG. 7B, the first grown crystal 12a including the first seed crystal 10a is cut along the second growth plane ($M_2$ line) which has a growth direction about 60° or about 120° different from the growth direction of the first a-plane growth step and an offset angle $\theta_2$ from the {11-20} plane of −15° to 15°. The position of the $M_2$ line is preferably selected such that differently oriented crystals or heterogeneous polytype crystals 14a and 16a are not exposed to the second growth plane and most of the first grown crystal 12a (+first seed crystal 10a) remains.

The first grown crystal 12a (+first seed crystal 10a) may be further cut along:
(1) a contour ($N_2$ line) for making the shape of the crystal after the expansion of the diameter close to the final shape of interest (circular in the example of FIG. 7) and/or
(2) a line which becomes the third growth plane ($M_3$ line).

Then, after the first grown crystal 12a (+first seed crystal 10a) is cut along the $M_2$ line and optionally along the $N_2$ line and the $M_3$ line, as shown in FIG. 7C, the obtained crystal is used directly as the second seed crystal 10b to grow an SiC single crystal on the {11-20} plane in the [2-1-10] direction (second a-plane growth step). Thereby, as shown in FIG. 7D, the second grown crystal 12b is obtained. Also, in this case, differently oriented crystals or heterogonous polytype crystals 14b and 16b may be grown at both ends of the second grown crystal 12b, respectively.

Then, the following steps are repeated similarly:
(1) the step of cutting the second grown crystal 12b (+second seed crystal 10b) along the third growth plane ($M_3$ line) and optionally along the contour ($N_3$ line, $N'_3$ line) so that most of the second grown crystal 12b (+second seed crystal 10b) remains (FIG. 7E);
(2) the step of growing SiC on the {11-20} plane in the [1-210] direction by using the second grown crystal 12b (+second seed crystal 10b) directly as the third seed crystal 10c (FIG. 7F);
(3) the step of cutting the third grown crystal 12c (+third seed crystal 10c) along the fourth growth plane ($M_4$ line) and optionally along the contour ($N_4$ line) so that most of the third grown crystal 12c (+third seed crystal 10c) remains (FIG. 7G);
(4) the step of growing SiC on the {11-20} plane in the [−1-120] direction by using the third grown crystal 12c (+third seed crystal 10c) directly as the fourth seed crystal 10d (FIG. 7H);
(5) the step of cutting the fourth grown crystal 12d (+fourth seed crystal 10d) along the fifth growth plane ($M_5$ line) and optionally along the contour ($N_5$ line) so that most of the fourth grown crystal 12d (+fourth seed crystal 10d) remains (FIG. 7I); and
(6) the step of growing SiC on the {11-20} plane in the [−2110] direction by using the fourth grown crystal 12d (+fourth seed crystal 10d) directly as the fifth seed crystal 10e (FIG. 7J).

Further, the following steps are carried out:
(7) the step of cutting the fifth grown crystal 12e (+fifth seed crystal 10e) along the sixth growth plane ($M_6$ line) and optionally along the contour ($N_6$ line) so that most of the fifth grown crystal 12e (+fifth seed crystal 10e) remains (FIG. 7K); and
(8) the step of growing SiC on the {11-20} plane in the [−12-10] direction by using the fifth grown crystal 12e (+fifth seed crystal 10e) directly as the sixth seed crystal 10f (FIG. 7L).

Finally, the sixth grown crystal 12f is shaped to obtain a circular SiC single crystal 12g as shown in FIG. 7M.

The growth crystal residual method can reduce the number of times of growth until the {0001} plane having a large diameter is produced.

Also, in general, when a crystal is grown by using a seed crystal having large L in the {0001} plane direction within the growth plane, stress becomes large and the grown crystal tends to be cracked. In contrast to this, the growth crystal residual method can reduce the probability of cracking since the number of times of growth using a seed crystal having relatively large L decreases.

[3.4. Other Methods of Reducing Heterogeneous Polytype Crystals or Differently Oriented Crystals]

Since the Si-plane side facet region is formed at the ends of the grown crystal in the {11-20} plane selective growth method, a high-quality single crystal is obtained only by this method. When one or more methods which can be applied to {11-20} plane growth out of the methods which will be described hereinafter are used in combination with the {11-20} plane selective growth method, the production probability of heterogeneous polytype crystals or differently oriented crystals can be further reduced.

[4. Example (2) of a-Plane Growth Method: Alternate Growth Method]

[4.1. Summary]

The alternate growth method is to repeat {11-20} plane growth and {1-100} plane growth whose growth direction different about 90° from that of the {11-20} growth alternately.

That is, the alternate growth method is a method in which the first a-plane growth step is a step for carrying out the {1-100} plane growth or {11-20} plane growth of the SiC Single crystal by using a first seed crystal having an offset angle $\theta_1$ from the {1-100} plane or the {11-20} plane of −15° to 15°, and the k-th a-plane growth step (2≤k≤n) is a step for cutting out the k-th seed crystal having the k-th growth plane with a growth direction about 90° different from the growth direction of the (k−1)-th a-plane growth step and an offset angle $\theta_k$ from the {11-20} plane or the {1-100} plane of −15° to 15° from the (k−1)-th grown crystal obtained in the (k−1)-th a-plane growth step, and carrying out the {11-20} plane growth or {1-100} plane growth of the SiC single crystal by using the k-th seed crystal.

By repeating the above growth, k-th seed crystals having a larger length in the {0001} plane direction are produced sequentially to increase the diameter.

Since the offset angle $\theta_k$ has been described above in detail, its explanation is omitted.

When {1-100} plane growth is carried out, the facet region is formed almost at the center of the surface of the growing crystal. Therefore, to obtain a high-quality crystal, additional means for maintaining the area ratio $S_{facet}$ of the Si-plane side facet region at a predetermined range must be taken at the time of {1-100} plane growth.

Meanwhile, when {11-20} plane growth is carried out, the facet region is formed at the ends of the surface of the grown crystal, and $S_{facet}$ becomes small naturally and can be maintained at a predetermined range. Therefore, to obtain a high-quality crystal, an additional means for maintaining the area ratio $S_{facet}$ of the Si-plane side facet region at a predetermined range does not always need to be taken. However, when such means is taken, the production probability of differently oriented crystals or heterogeneous polytype crystals can be further reduced.

Such means includes the following. The means which are explained below may be used alone or in combination of two or more as long as it is physically applicable.

[4.2 Method of Reducing the Area Ratio $S_{facet}$ of the Si-plane Side Facet Region]

[4.2.1. c-Axis Direction Asymmetrical Growth Method]

A first example of the means of reducing the area ratio $S_{facet}$ of the Si-plane side facet region is a c-axis direction asymmetrical growth method.

That is, the c-axis direction asymmetrical growth method is a method in which the k-th a-plane growth step (1≤k≤n) is a step for carrying out the {1-100} plane growth or {11-20} plane growth of the SiC single crystal so that the topmost portion of the {1-100} plane facet is situated on the Si-plane near side with respect to the center in the c-axis direction of the k-th growth plane.

Here, the term "center in the c-axis direction" means the center of the intersections between a line perpendicular to the {0001} plane and the surfaces of the growing crystal.

Figure 8:
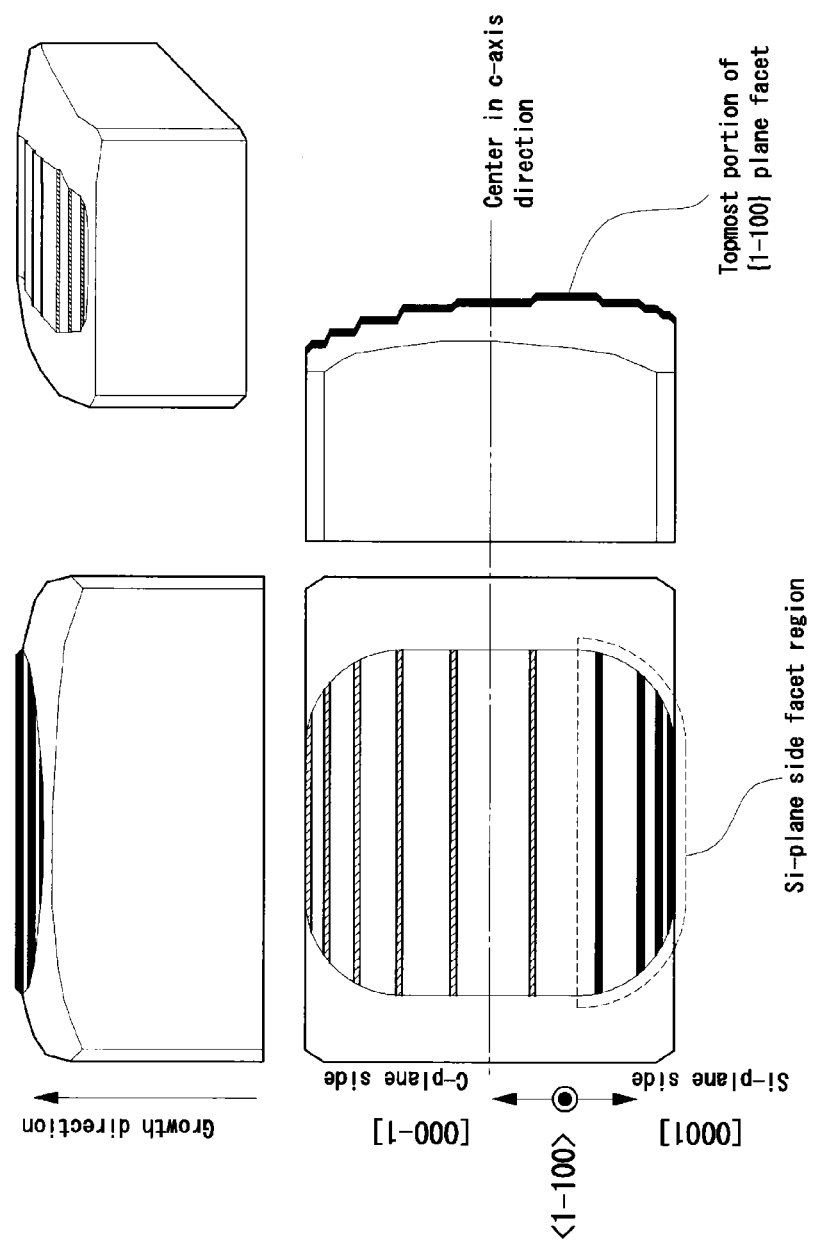
FIG. 8 are a plan view, (lower left), a front view (upper left), a right side view (lower right) and a perspective view (upper right) of an SiC single crystal which has been grown on the {1-100} plane so that it becomes asymmetrical in the c-axis direction.

FIG. 8 show a plan view (lower left), a front view (upper left), a right side view (lower right) and a perspective view (upper right) of an SiC single crystal grown on the {1-100} plane so that it is grown asymmetrical in the c-axis direction.

As shown in FIG. 8, when the topmost portion of the {0001} plane facet is situated on the Si-plane near side with respect to the center in the c-axis direction at the time of {1-100} plane growth, the area of the Si-plane side facet region can be reduced. As a result, the deterioration of the grown crystal due to the production of differently oriented crystals or heterogeneous polytype crystals can be suppressed.

Although not shown, when the topmost portion of the {0001} plane facet is also situated on the Si-plane near side at the time of {11-20} plane growth, the area of the Si-plane side facet region can be further reduced. Asymmetrical growth in the c-axis direction may be applied to either one or both of {1-100} plane growth and {11-20} plane growth.

There are various methods for asymmetrical growth in the c-axis direction. A first method is to make the temperature on the Si-plane side lower than that at the center in the c-axis direction at the time of {1-100} plane growth or {11-20} plane growth.

The method for lowering the temperature on the Si-plane side is a method in which the k-th a-plane growth step (1≤k≤n) is a step for carrying out the {1-100} plane growth or {11-20} plane growth of the SiC single crystal so that the temperature on the Si-plane near side with respect to the center in the c-axis direction of the k-th growth plane becomes lower than that at the center in the c-axis direction.

Figure 9:
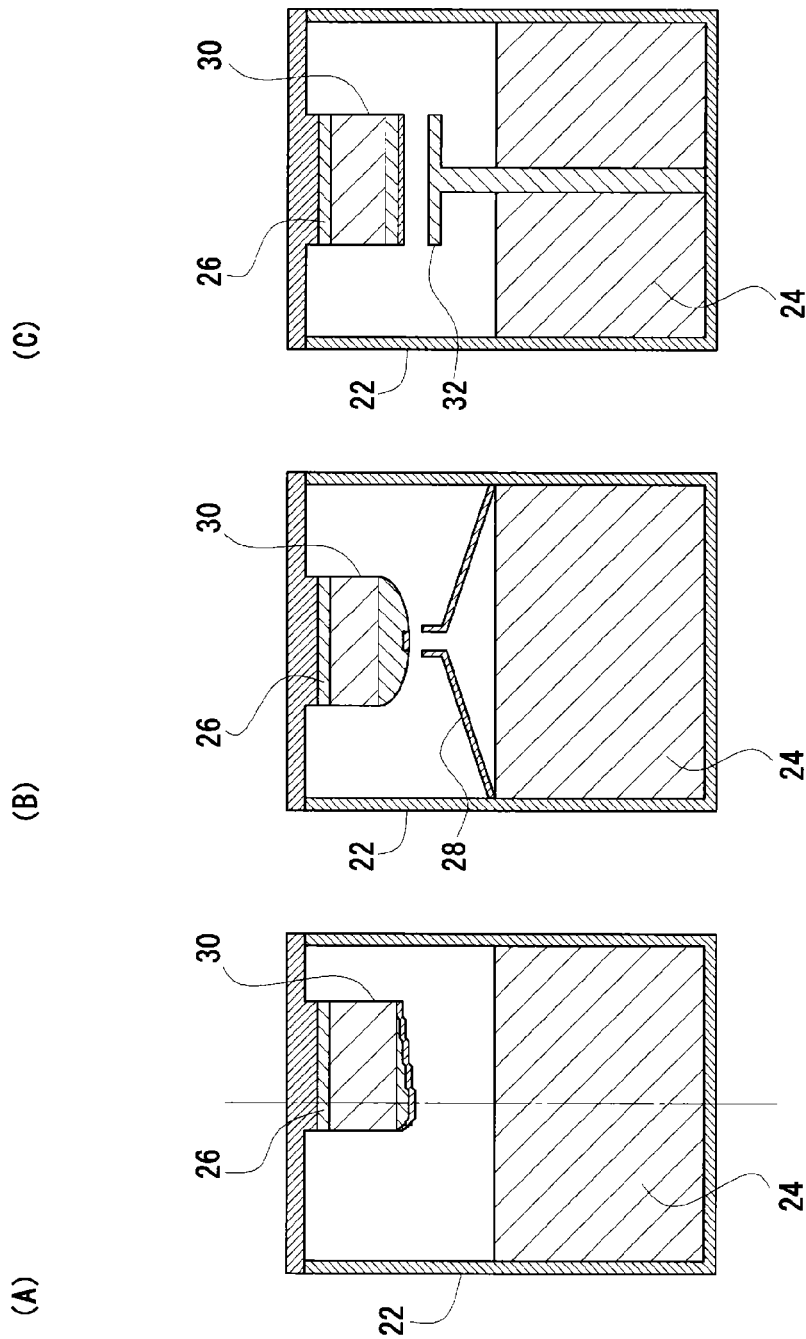
FIG. 9A is a conceptual diagram for explaining a method for lowering the temperature on the Si-plane near side.
FIG. 9B is a conceptual diagram for explaining a method for selectively increasing the SiC gas concentration of a part of the surface of a growing crystal.
FIG. 9C is a conceptual diagram for explaining a method for growing a flat {1-100} plane.

As the method of lowering the temperature on the Si-plane near side, for example, there is a method shown in FIG. 9A. That is, a raw material 24 is charged into a crucible 22, and a seed crystal 26 is fixed at the top of the crucible 22. It is known that the growth plane must be kept convex to a certain degree when an SiC single crystal is grown. To this end, the crucible structure is devised, the position of the crucible in a furnace is adjusted, and the temperature near the center of the crucible becomes lowest in the vicinity of the single crystal in the crucible. Although the detailed structure of the crucible is not shown in the diagram, it is supposed that a structure in which the temperature near the center of the crucible becomes lowest is adopted. Therefore, when the center of the seed crystal 26 is displaced from the center of the crucible 22 and the Si-plane near side is moved close to the center of the crucible 22, the temperature on the Si-plane near side lowers. As a result, the topmost portion of the {1-100} plane facet of the growing crystal 30 is displaced to the Si-plane near side. Thereby, the area of the Si-plane side facet region is reduced.

A second method for carrying out c-axis direction asymmetrical growth is a method in which the concentration of SiC gas on the Si-plane near side is made higher than that at the center in the c-axis direction at the time of {1-100} plane growth or {11-20} plane growth.

The method for increasing the concentration of SiC gas on the Si-plane near side is a method in which the k-th a-plane growth step (1≤k≤n) is a step for carrying out the {1-100} plane growth or {11-20} plane growth of the SiC single crystal so that the concentration of SiC gas on the Si-plane near side with respect to the center in the c-axis direction of the k-th growth plane becomes higher than that at the center in the c-axis direction.

As the method for increasing the concentration of SiC gas on the Si-plane near side, for example, there is a method shown in FIG. 9B. That is, the raw material 24 is charged into the crucible 22, and the seed crystal 26 is fixed at the top of the crucible 22. Further, a sublimation gas guide 28 is provided above the raw material 24 so as to supply SiC gas to a specific site of the surface of the growing crystal preferentially. At this point, when the end of the sublimation gas guide 28 is disposed such that SiC gas is supplied to the Si-plane near side preferentially, the concentration of SiC gas near the end of the sublimation gas guide 28 becomes highest. As a result, the topmost portion of the {1-100} plane facet of the growing crystal 30 is displaced to the Si-plane near side. Also, the area of the Si-plane side facet region is thereby reduced.

A third method for carrying out c-axis direction asymmetrical growth is a method in which an asymmetrical seed crystal having a large length on the Si-plane near side is used as a seed crystal at the time of {11-20} plane growth.

That is, the method using the asymmetrical seed crystal is a method in which when the k-th a-plane growth step (1≤k≤n) is a step for carrying out the {11-20} plane growth of the SiC single crystal, the k-th a-plane growth step is a step for carrying out {11-20} plane growth of SiC by using the k-th seed crystal having a larger length on the Si-plane near side with respect to the center in the c-axis direction than the length on the C-plane near side.

Figure 10:
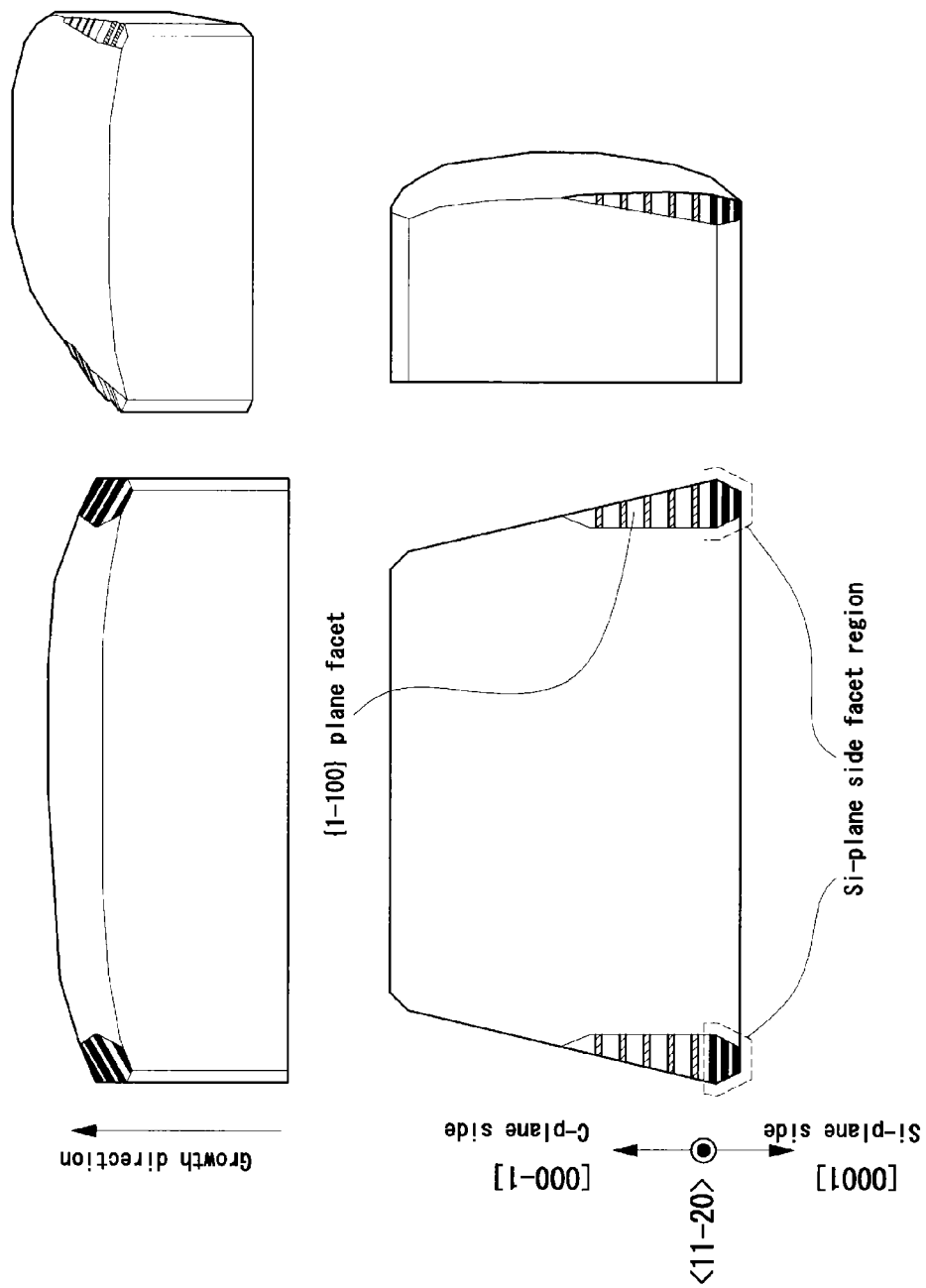
FIG. 10 are a plan view (lower left), a front view (upper left), a right side view (lower right) and a perspective view (upper right) of an SiC single crystal which has been grown on the {11-20} plane by using an asymmetrical seed crystal.

FIG. 10 show a plan view (lower left), a front view (upper left), a right side view (lower right) and a perspective view (upper right) of an SiC single crystal grown on the {11-20} plane by using an asymmetrical seed crystal.

As described above, the facet region is formed at both ends of the growing crystal at the time of {11-20} plane growth. At this point, as shown in FIG. 10, when the length on the Si-plane near side of the seed crystal is made large, the facet region is displaced to the Si-plane near side and the topmost portion of the {1-100} plane facet is displaced to the Si-plane near side at the same time. Therefore, the area of the Si-plane side facet region is reduced as compared with when a symmetrical seed crystal is used.

[4.2.2. Polar Plane Step of Si-Plane Side Annihilation Method (Joined Seed Crystal)]

A second example of the means of reducing the area ratio $S_{facet}$ of Si-plane side facet region is a method for annihilating polar plane steps of Si-plane side themselves.

That is, the polar plane step of Si-plane side annihilation method is a method in which the k-th a-plane growth step ($1 \leq k \leq n$) is a step for carrying out the {1-100} plane growth or {11-20} plane growth of SiC by using the k-th seed crystal obtained by joining together at least two seed crystal segments so that the Si-planes of the seed crystal segments are opposed to each other.

Each of the seed crystal segments opposed to each other through the Si-planes may be a monolithic seed crystal segment or an assembly of a plurality of seed crystal segments joined together in such a manner that their Si-planes face the same direction.

Figure 11:
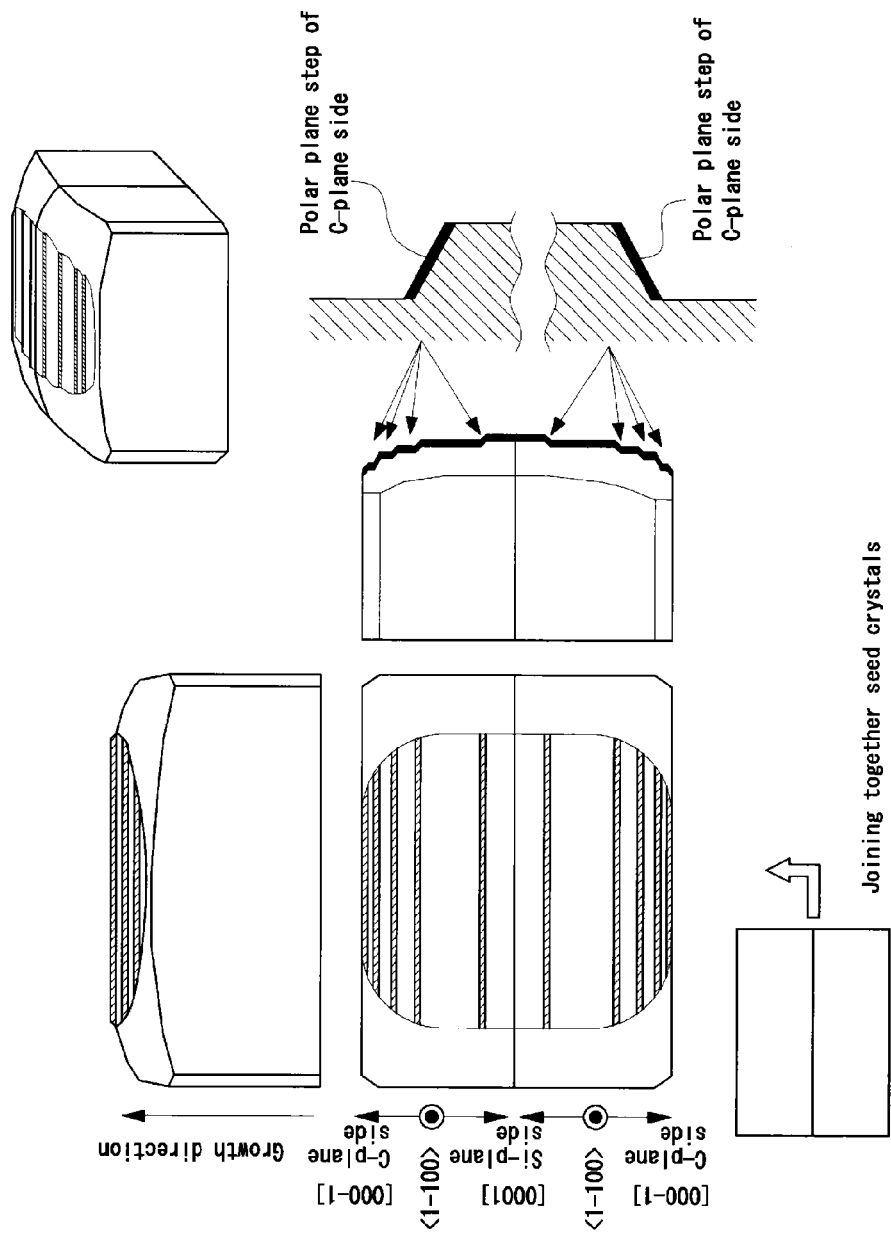
FIG. 11 are a plan view (center left), a front view (upper left), a right side view (center middle), a perspective view (upper right) and a partially enlarged right side view (center right) of an SiC single crystal which has been grown on the {1-100} plane by using a seed crystal obtained by joining together the Si-plane sides of seed crystal segments, and a plan view (lower left) of the seed crystal obtained by joining together the Si-plane sides of the seed crystal segments.

FIG. 11 show a plan view (center left), a front view (upper left), a right side view (center middle), a perspective view (upper right) and a partially enlarged right side view (center right) of an SiC single crystal grown on the {1-100} plane by using a seed crystal obtained by joining together the Si-plane sides of seed crystal segments, and a plan view (lower left) of the seed crystal obtained by joining together the Si-plane sides of the seed crystal segments.

When a seed crystal is obtained by joining together two seed crystal segments in such a manner that their Si-planes are opposed to each other, the end planes in the c-axis direction of the seed crystal become C-planes. When {1-100} plane growth is carried out by using this seed crystal, all the steps formed between {1-100} plane facets become polar plane steps of C-plane side. That is, according to this method, the Si-plane side facet region substantially disappears. As a result, the production probability of differently oriented crystals or heterogeneous polytype crystals is significantly reduced.

Figure 19:
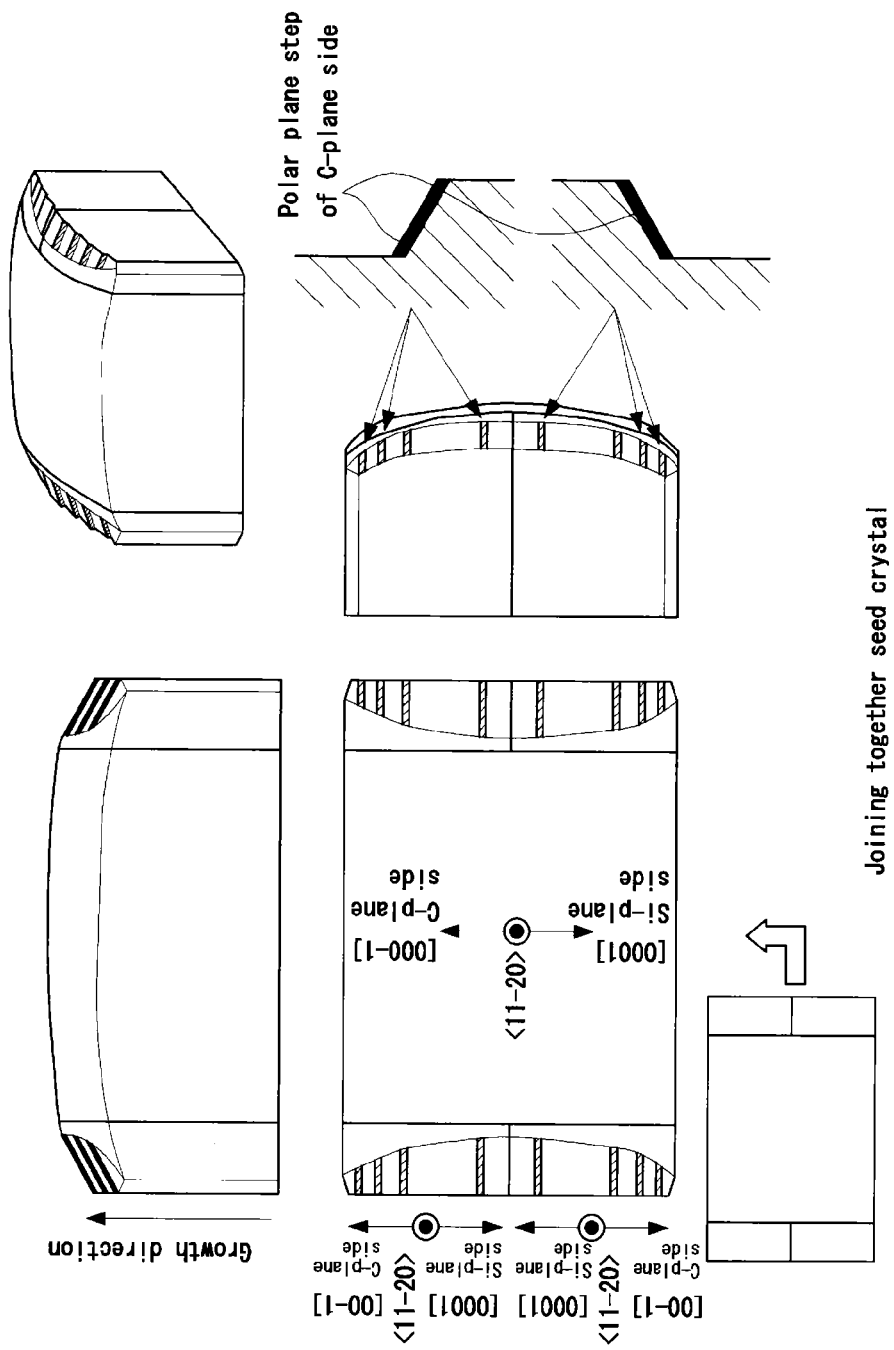
FIG. 19 are a plan view (center left), a front view (upper left), a right side view (center middle), a perspective view (upper right) and partially enlarged ride side view (center right) of an SiC single crystal which has been grown on the {11-20} plane by using a seed crystal obtained by joining together the Si-plane sides of seed crystal segments, and a plan view (lower left) of the seed crystal obtained by joining together the Si-plane sides of the seed crystal segments.

FIG. 19 show a plan view (center left), a front view (upper left), a right side view (center middle), a perspective view (upper right) and a partially enlarged right side view (center right) of an SiC single crystal grown on the {11-20} plane by using a seed crystal obtained by joining together the Si-plane sides of seed crystal segments, and a plan view (lower left) of the seed crystal obtained by joining together the Si-plane sides of the seed crystal segments.

In general, as shown in FIG. 2, the facet appears at the both ends of the surface of the growing crystal in {11-20} plane growth and the Si-plane side facet region is formed on the Si-plane side. Then, seed crystal segments are arranged at both end portions of a seed crystal where a facet is formed in such a manner that their Si-plane sides are opposed to each other.

Here, the center portion of the seed crystal is composed of a monolithic seed crystal which is obtained without joining the Si-plane side. It is based on the reason that:
(a) the yield of a {0001} plane wafer taken out from the grown crystal becomes high because the monolithically grown crystal does not contain a low-quality bonding interface and
(b) a facet is not formed in the center portion.

In the seed crystal arranged like this, both the end planes in the c-axis direction of the both end portions of seed crystal become C-planes. When {11-20} plane growth is carried out by using this seed crystal, all the steps formed between {1-100} plane facets at the both ends of the grown crystal become polar plane steps of C-plane side. That is, according to this method, even in the {11-20} plane growth, the Si-plane side facet region can be substantially annihilated. As a result, the production probability of differently oriented crystals or heterogeneous polytype crystals is significantly reduced. In case of the {1-100} plane growth, the bonding interface in the growing crystal is produced by joining the Si-plane sides. On the other hand, in case of the {11-20} plane growth, since such a bonding interface does not exist in the center portion of the growing crystal, the yield of the {0001} plane wafer taken out becomes high.

The polar plane step of Si-plane side annihilation method may be applied to either one or both of {1-100} plane growth and {11-20} plane growth.

[4.2.3. {1-100} Plane Flat Growth Method]

A third example of the means of reducing the area ratio $S_{facet}$ of Si-plane side facet region is a method for growing the {1-100} plane flat near the topmost portion at the time of {1-100} plane growth.

The {1-100} plane flat growth method is, more specifically, a method in which when the k-th a-plane growth step ($1 \leq k \leq n$) is a step for carrying out the {1-100} plane growth of the SiC single crystal, the k-th a-plane growth step is a step for carrying out the {1-100} plane growth of the SiC single crystal such that the area of a region in which the height difference within the facet region is 1 mm or less accounts for 90% or more of the total area of the facet region.

The term "region in which the height difference is 1 mm or less" is a region including the topmost portion of the {1-100} plane facet and the {1-100} plane facet adjacent to this, and a region within 1 mm from the topmost portion of the {1-100} plane facet (that is, a region in which the number of polar plane steps is relatively small).

Figure 12:
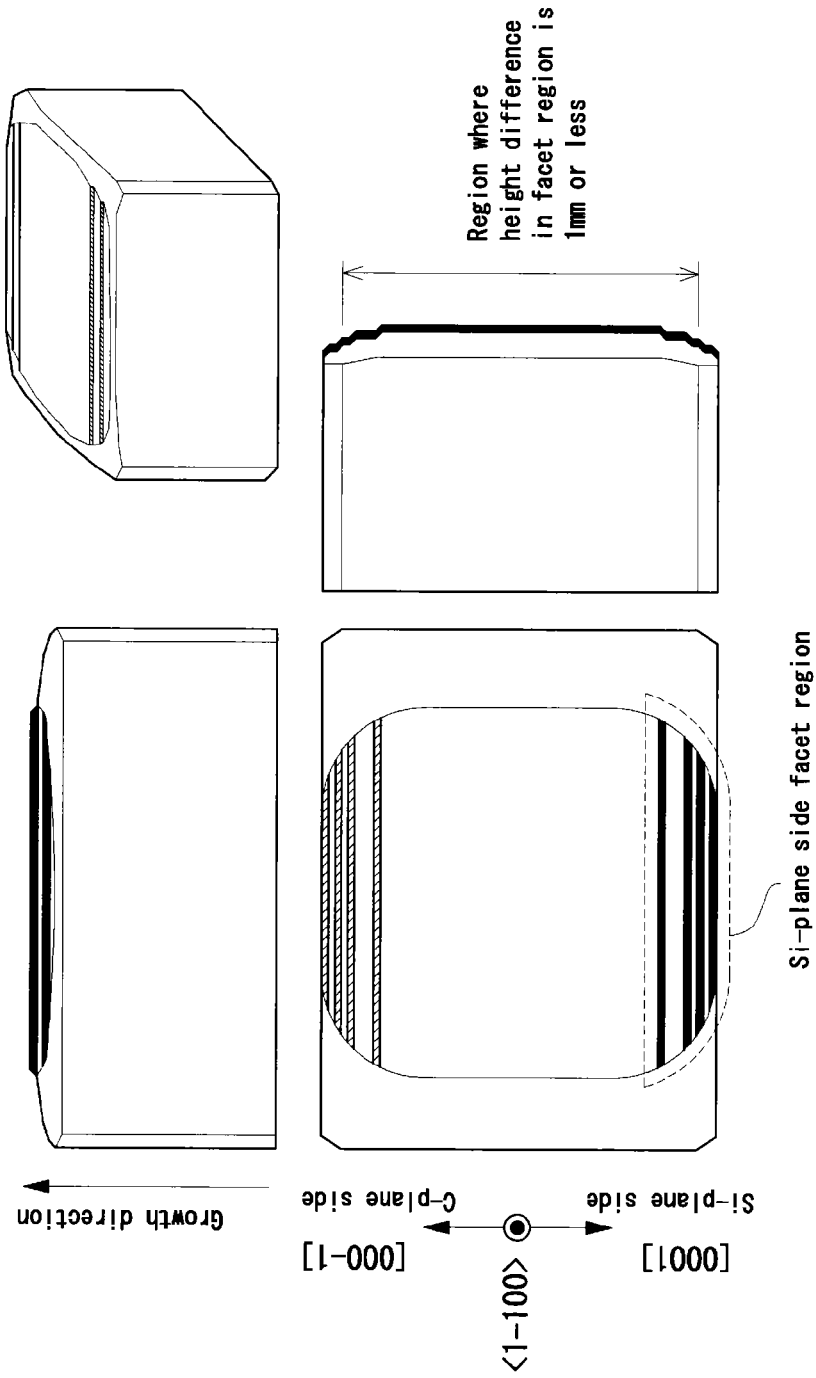
FIG. 12 are a plan view (lower left), a front view (upper left), a right side view (lower right) and a perspective view (upper right) of an SiC single crystal whose {1-100} plane has been grown flat.

FIG. 12 show a plan view (lower left), a front view (upper left), a right side view (lower right) and a perspective view (upper right) of an SiC single crystal whose {1-100} plane has been grown flat.

As shown in FIG. 12, when the growth plane is kept flat from the beginning of growth to the end of growth in the case of {1-100} plane growth, the topmost portion of the {1-100} plane facet becomes wide and "the region in which the height difference is 1 mm or less" expands. As a result, the area of the Si-plane side facet region is reduced. Thereby, the production probability of differently oriented crystals or heterogeneous polytype crystals is significantly reduced.

As a method for growing the {1-100} plane flat, for example, there is a method shown in FIG. 9C. That is, the raw material 24 is charged into the crucible 22, and the seed crystal 26 is fixed at the top of the crucible 22. Further, a soaking plate 32 is installed at a position opposite to the surface of the growing crystal 30. When the soaking plate 32 is installed, the temperature difference within the horizontal plane becomes small in the vicinity of the surface of the growing crystal 30. As a result, the surface of the growing crystal 30 becomes flat. Thereby, the area of the Si-plane side facet region is reduced.

[4.2.4. Convex Growth Method in the {0001} Plane Direction]

A fourth example of the means of reducing the area ratio $S_{facet}$ of Si-plane side facet region is a method for growing the {1-100} plane convex in the {0001} plane direction at the time of {1-100} plane growth.

The convex growth method is, specifically, a method in which when the k-th a-plane growth step ($1 \leq k \leq n$) is a step for carrying out the {1-100} plane growth of the SiC single crystal, the k-th a-plane growth step is a step for carrying out the {1-100} plane growth of the SiC single crystal such that the surface of the k-th grown crystal becomes convex in the {0001} plane direction, that is, such that r<L is satisfied ("L" represents the length in the {0001} plane direction of the k-th grown crystal and "r" represents the curvature in the {0001} plane direction of the surface of the k-th grown crystal).

When convex growth is carried out, the surface of the growing crystal may be grown symmetrical or asymmetrical to the center in the c-plane direction.

That is, when convex growth is carried out, the k-th a-plane growth step ($1 \leq k \leq n$) may be a step for carrying out the {1-100} plane growth of the SiC single crystal such that the topmost portion of the {1-100} plane facet is situated on the end side with respect to the center in the c-plane direction of the k-th growth plane.

The term "center in the c-plane direction" means the center of the intersections between a line parallel to the {0001} plane and the surfaces of the growing crystal.

The term "convex" means that r<L is satisfied, wherein "L" represents the length in the {0001} plane direction of the grown crystal and "r" represents the curvature in the {0001} plane direction of the surface of the grown crystal (the curvature of a line segment where a flat plane passing the center of the growth plane and perpendicular to the growth plane intersects the surface of the grown crystal).

Figure 13:
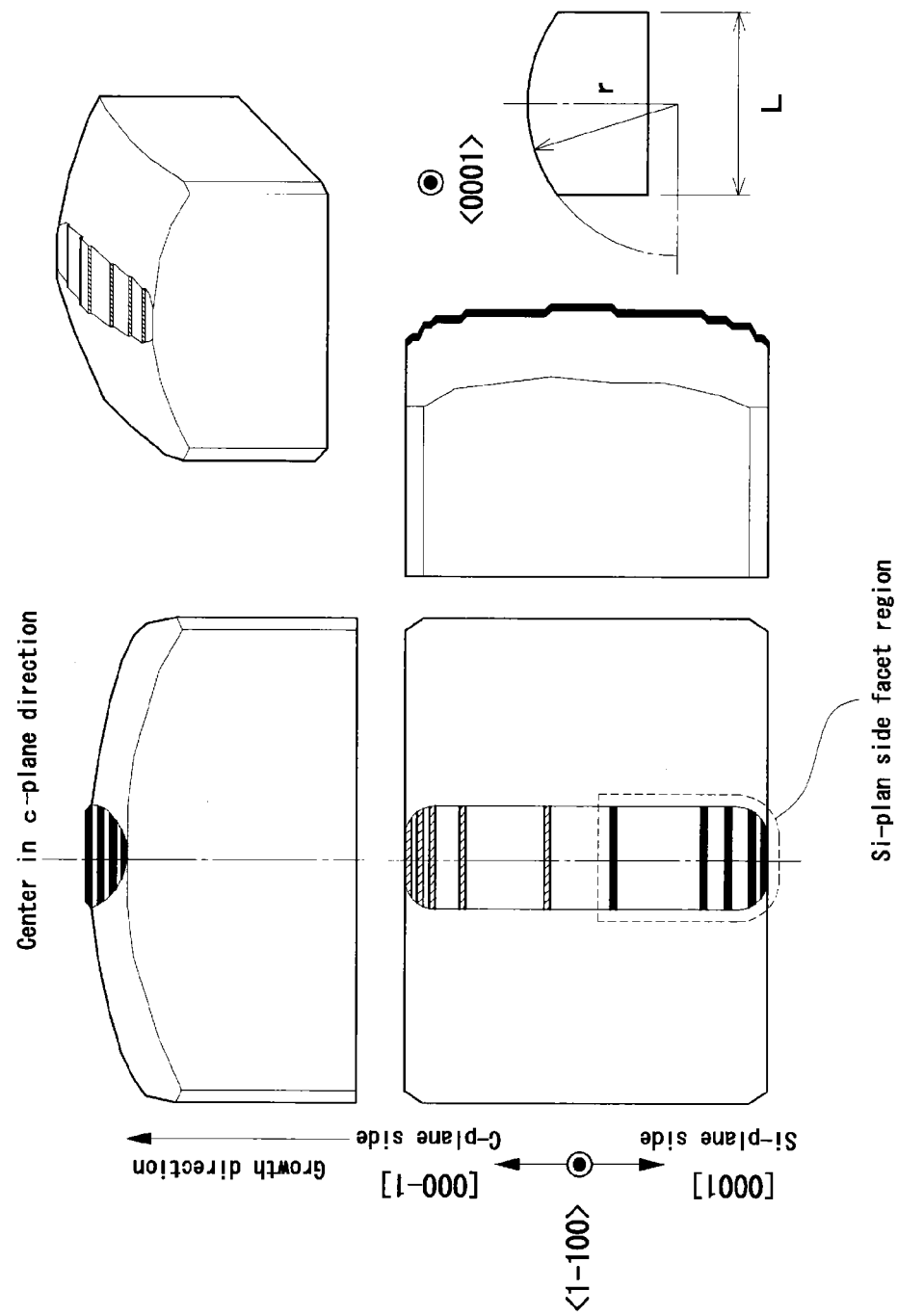
FIG. 13 are a plan view (lower left), a front view (upper left), a right side view (lower middle) and a perspective view (upper right) of an SiC single crystal which has been grown on the {1-100} plane so that it becomes convex in the {0001} plane direction and becomes symmetrical to the center in the c-plane direction, and a schematic diagram (lower right) showing the relationship between "r" and "L"

FIG. 13 show a plan view (lower left), a front view (upper left), a right side view (lower middle) and a perspective view (upper right) of an SiC single crystal which has been grown on the {1-100} plane such that it becomes convex in the {0001} plane direction and symmetrical to the center in the c-plane direction and a schematic diagram (lower right) showing the relationship between "r" and "L".

As shown in FIG. 13, when {1-100} plane growth is carried out, if a crystal is grown to become convex in the {0001} plane direction, the width in the {0001} plane direction of the facet region becomes small. As a result, the area of the facet region itself is reduced. Thereby, the area of the Si-plane side facet region is also reduced.

Figure 14:
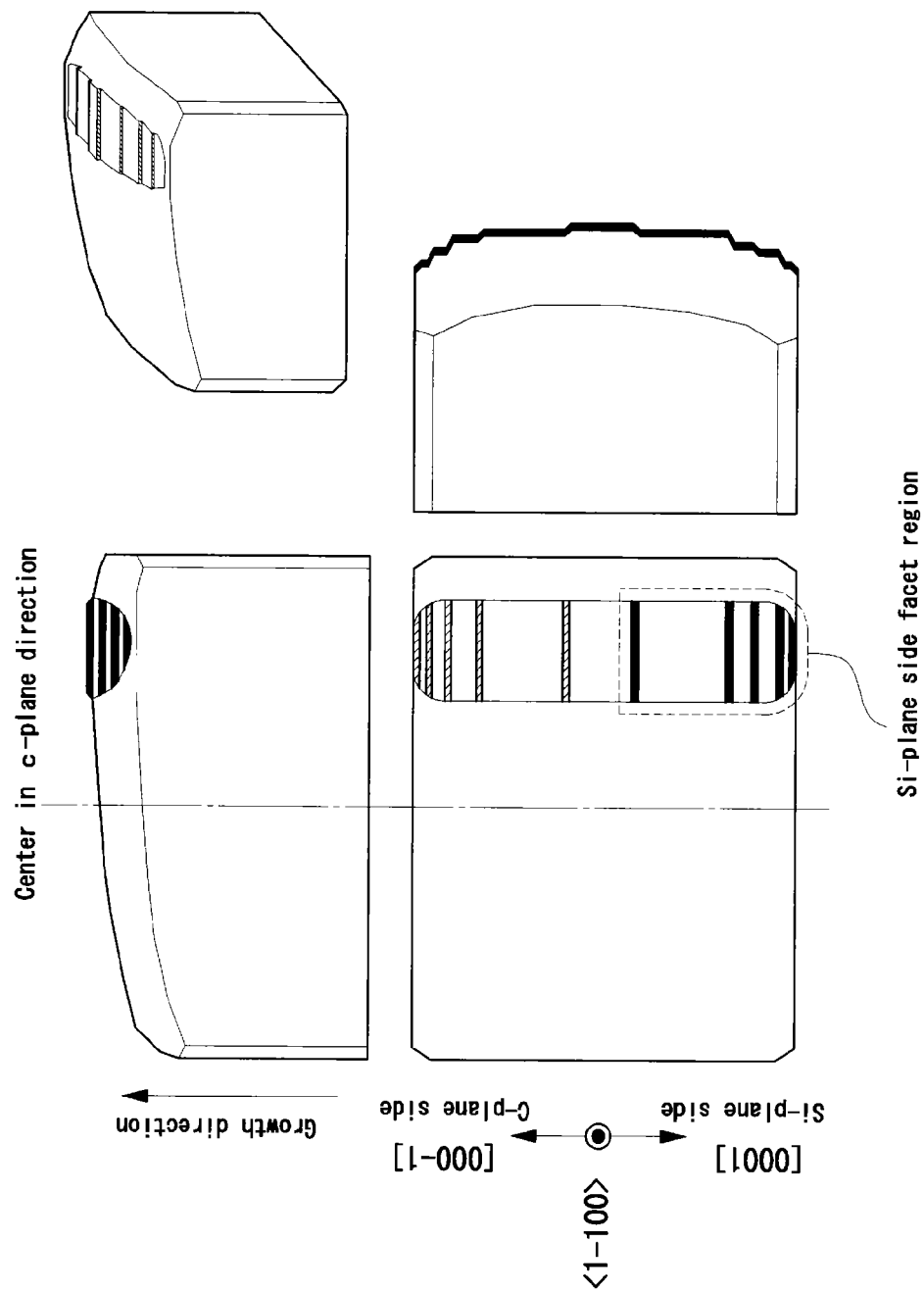
FIG. 14 are a plan view (lower left), a front view (upper left), a right side view (lower right) and a perspective view (upper right) of an SiC single crystal which has been grown on the {1-100} plane so that it becomes convex in the {0001} plane direction and becomes asymmetrical to the center in the c-plane direction.

FIG. 14 show a plan view (lower left), a front view (upper left), a right side view (lower right) and a perspective view (upper right) of an SiC single crystal which has been grown on the {1-100} plane such that it becomes convex in the {0001} plane direction and asymmetrical to the center in the c-plane direction.

As shown in FIG. 14, when the SiC single crystal is grown on the {1-100} plane such that it becomes convex in the {0001} plane direction and asymmetrical to the center in the c-plane direction, the reduced Si-plane side facet region moves toward the end of the growing crystal. Therefore, the production of differently oriented crystals or heterogeneous polytype crystals near the center of the growing crystal can be suppressed.

To grow a convex crystal, more specifically, as shown in FIG. 9B, there is a method in which the concentration of SiC gas at a specific site of the surface of the growing crystal 30 is increased by using the sublimation gas guide 28.

[4.2.5. Nitrogen Dope Amount Reduction Growth Method]

A fifth example of the means of reducing the area ratio $S_{facet}$ of Si-plane side facet region is a method for reducing the amount of nitrogen dope at the time of {1-100} plane growth or {11-20} plane growth.

This nitrogen dope amount reduction growth method is, specifically, a method in which the k-th a-plane growth step ($1 \leq k \leq n$) is a step for carrying out the {1-100} plane growth or {11-20} plane growth of SiC in an atmosphere where the nitrogen gas partial pressure is 5% or less.

In general, in order to reduce the resistance of a device to be manufactured on a substrate, the growth of an SiC single crystal is often conducted while nitrogen is introduced into a growth atmosphere. The nitrogen dope is essential at the time of c-plane growth for cutting out a wafer but not essential at the time of a-plane growth which is a quality improving process.

On the contrary, when a-plane growth is carried out while nitrogen is doped, if the amount of nitrogen dope is large, the production frequency of differently oriented crystals or heterogeneous polytype crystals increases. Therefore, the nitrogen gas partial pressure is preferably 5% or less. The nitrogen gas partial pressure is more preferably 1% or less.

Figure 15:
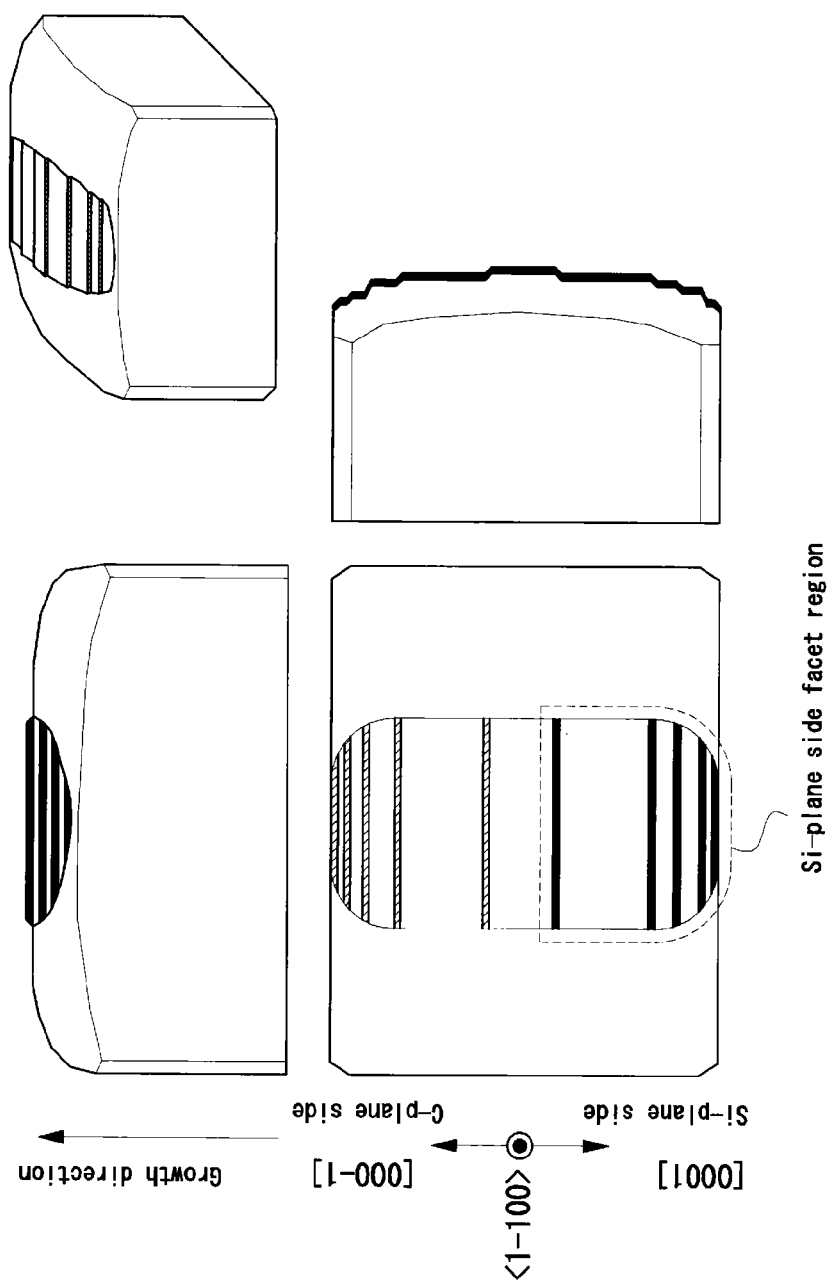
FIG. 15 are a plan view (lower left), a front view (upper left), a right side view (lower right) and a perspective view (upper right) of an SiC single crystal which has been grown on the {1-100} plane by using a nitrogen dope amount reduction growth method.

FIG. 15 show a plan view (lower left), a front view (upper left), a right side view (lower right) and a perspective view (upper right) of an SiC single crystal which has been grown on the {1-100} plane by using the nitrogen dope amount reduction growth method.

When a-place growth is carried out while nitrogen is doped, the production frequency of differently oriented crystals or heterogeneous polytype crystals in the Si-plane side facet region is decreased by reducing the amount of nitrogen dope.

This is considered to be due to the following:
(1) when the amount of nitrogen dope is reduced, as shown in FIG. 15, the width in the {0001} plane direction of the facet region is slightly reduced and the area of the Si-plane side facet region is also reduced accordingly; and
(2) though a detailed reason is not known, when {1-100} plane growth is carried out with a small amount of nitrogen dope, the production frequency itself of differently oriented crystals or heterogeneous polytype crystals decreases.

[4.2.6. Dummy Seed Crystal Placement Method]

A sixth example of the means of reducing the area ratio $S_{facet}$ of Si-plane side facet region is a method in which a dummy seed crystal is placed next to the main seed crystal at the time of {1-100} plane growth or {11-20} plane growth.

The dummy seed crystal placement method is, specifically, a method in which the k-th a-plane growth step ($1 \leq k \leq n$) is a step for producing the k-th seed crystal by placing a dummy seed crystal next to the main seed crystal, and carrying out {1-100} plane growth or {11-20} plane growth of SiC by using the k-th seed crystal.

The main seed crystal becomes a block body whose thickness is increased by repeating growth.

This method differs from the above-described polar plane steps of Si-plane side annihilation method in the following points. That is, the dummy seed crystal may be an ordinary thin seed crystal. The surface of the dummy seed crystal does not need to be polished because the dummy seed crystal is cut off from the grown crystal in the end. Further, crystal orientation of the dummy seed crystal is not limited. The dummy seed crystal may be a monolithic seed crystal segment or an assembly of a plurality of seed crystal segments which are joined together.

Figure 20:
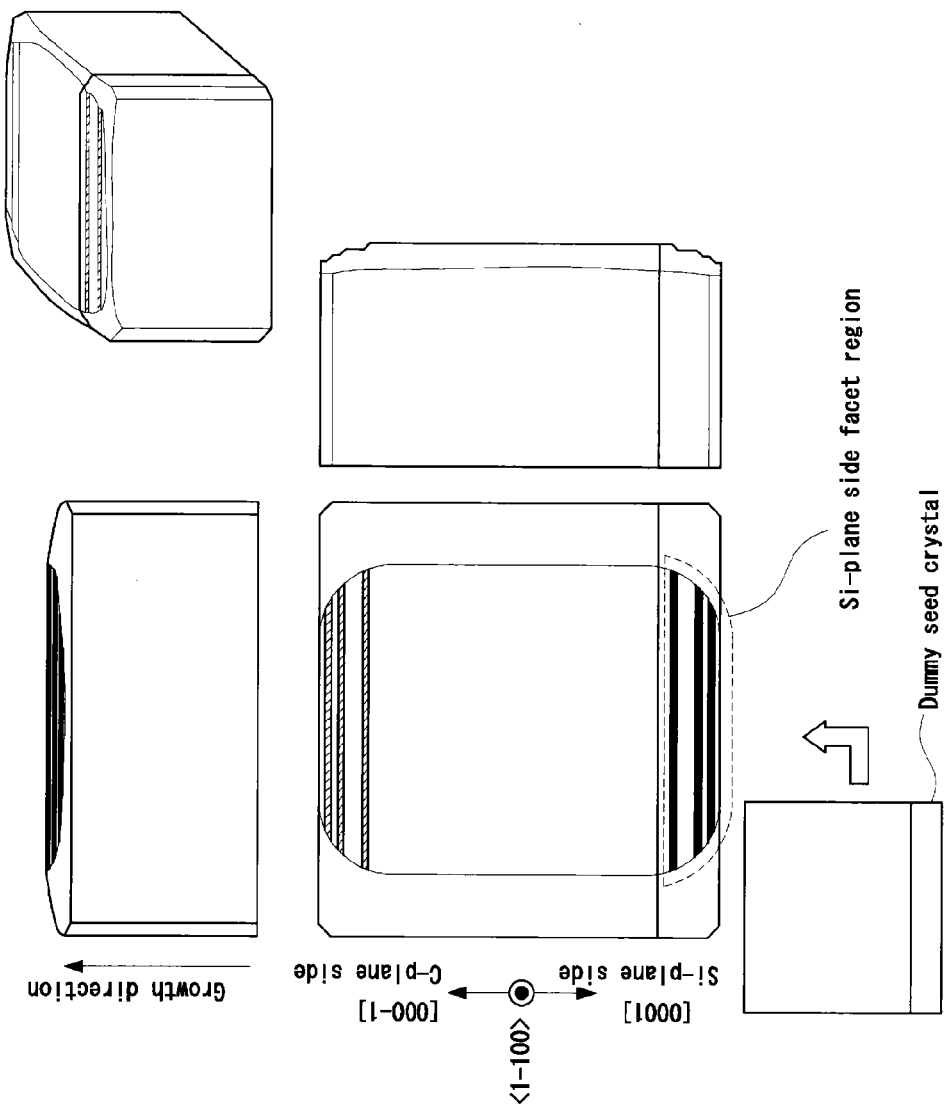
FIG. 20 are a plan view (center left), a front view (upper left), a right side view (center right) and a perspective view (upper right) of an SiC single crystal which has been grown on the {1-100} plane by using a seed crystal obtained by placing a dummy seed crystal next to a main seed crystal, and a plan view (lower left) of the seed crystal obtained by joining the dummy seed crystal to the main seed crystal.

FIG. 20 show a plan view (center left), a front view (upper left), a right side view (center right) and a perspective view (upper right) of an SiC single crystal which has been grown on the {1-100} plane by using a seed crystal obtained by placing a dummy seed crystal next to the main seed crystal, and a plan view (lower left) of the seed crystal obtained by joining the dummy seed crystal to the main seed crystal.

When an SiC single crystal is grown by using a seed crystal obtained by placing a dummy seed crystal on the Si-plane side of the main seed crystal, the curvature in the <0001> direction of the surface becomes small on a crystal which is grown on the main seed crystal and polar plane steps of Si-plane side are selectively formed on the dummy seed crystal. That is, according to this method, even when differently oriented crystals or heterogeneous polytype crystals are produced in the Si-plane side facet region, the crystal grown on the main seed crystal is hardly affected by these crystals.

Figure 21:
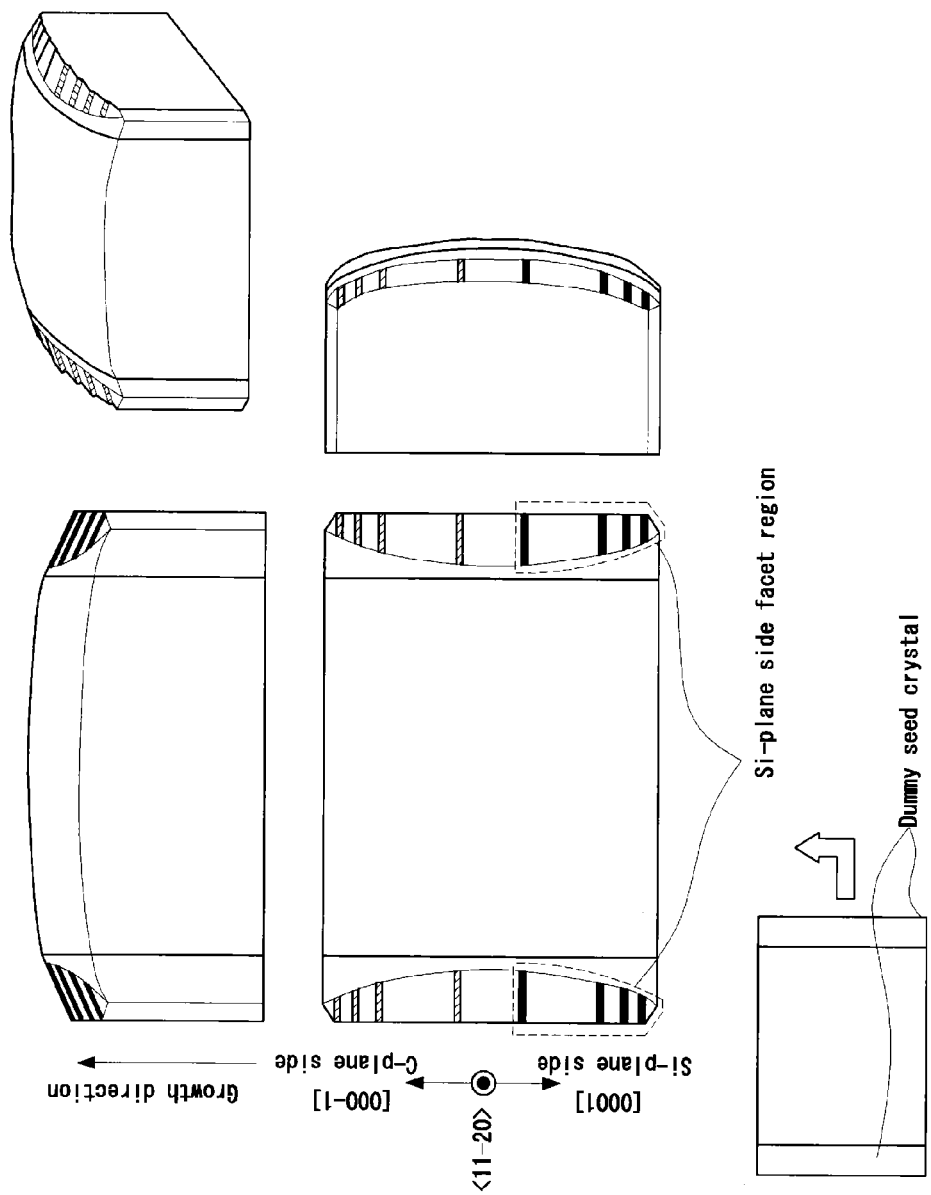
FIG. 21 are a plan view (center left), a front view (upper left), a right side view (center right) and a perspective view (upper right) of an SiC single crystal which has been grown on the {11-20} plane by using a seed crystal obtained by placing a dummy seed crystal next to a main seed crystal, and a plan view (lower left) of the seed crystal obtained by joining the dummy seed crystal to the main seed crystal.

FIG. 21 show a plan view (center left), a front view (upper left), a right side view (center right) and a perspective view (upper right) of an SiC single crystal which has been grown on {11-20} plane by using a seed crystal obtained by placing a dummy seed crystal next to the main seed crystal and a plan view (lower left) of the seed crystal obtained by joining the dummy seed crystal to the main seed crystal.

When the SiC single crystal is grown by using a seed crystal obtained by placing the dummy seed crystals at both ends in the {0001} plane direction of the main seed crystal, the curvature in the {0001} plane direction of the surface becomes small on a crystal which is grown on the main seed crystal and a facet tends to be selectively formed on the dummy seed crystal. That is, according to this method, even when differently oriented crystals or heterogeneous polytype crystals are produced in the Si-plane side facet region, the crystal grown on the main seed crystal is hardly affected by these crystals.

The above dummy seed crystal placement method may be applied to either one or both of {1-100} plane growth and {11-20} plane growth.

[5. Method for Producing SiC Single Crystal (2)]

The method for producing an SiC single crystal according to a second embodiment of the present invention comprises an a-plane growth step and a c-plane growth step.

[5.1. a-Plane Growth Step]

The a-plane growth step is a step for repeating a-plane growth two times or more so that the area ratio $S_{facet}$ of the Si-plane side facet region is maintained at a predetermined value or less.

As for details of the a-plane growth step, since it is the same as that of the first embodiment, its explanation is omitted.

[5.2. c-Plane Growth Step]

The c-plane growth step is a step for cutting out a (n+1)-th seed crystal having a (n+1)-th growth plane with an absolute value of offset angle from the {0001} plane of 30° or less from the n-th grown crystal obtained in the n-th a-plane growth step, and carrying out the c-plane growth of the SiC single crystal on the (n+1)-th growth plane.

When the absolute value of offset angle is too large at the time of c-plane growth, a larger growth height is required to discharge a stacking fault carried over to the growing crystal from the n-th grown crystal to the outside of the growing crystal. When the absolute value of offset angle becomes too large, a new stacking fault may be produced in the growing crystal. Therefore, the absolute value of offset angle from the {0001} plane is preferably 30° or less.

The a-plane grown crystal obtained by the method according to the first embodiment has a large diameter of the {0001} plane and contains few differently oriented crystals or few heterogeneous polytype crystals. Therefore, when a seed crystal for c-plane growth is cut out from the a-plane grown crystal and c-plane growth is carried out by using the seed crystal, a c-plane grown crystal having a large diameter of the {0001} plane and few defects can be produced.

[6. SiC Single Crystal: a-Plane Grown Crystal]

When the method according to the first embodiment is used, an a-plane grown crystal having few defects is obtained. Stated more specifically, an SiC single crystal containing no differently oriented crystals or no heterogeneous polytype crystals in a region excluding 20% of the region from the periphery is obtained.

[6.1. Differently Oriented Crystalline Masses and Heterogeneous Polytype Crystalline Masses]

Figure 16:
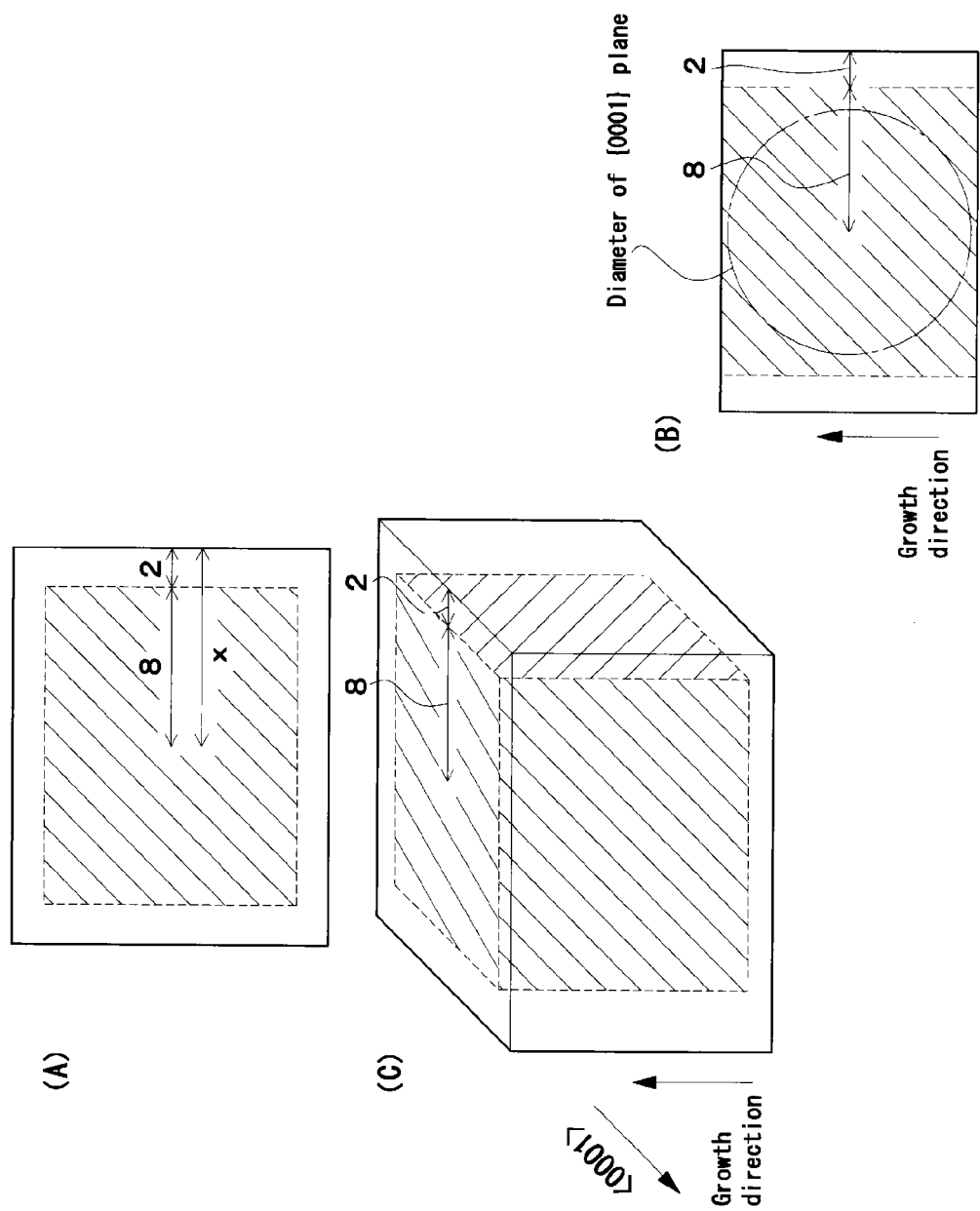
FIG. 16A is a plan view.
FIG. 16B is a front view and FIG. 16C is a perspective view of an SiC single crystal produced by using the a-plane growth method of the present invention.

FIG. 16 show a plan view (FIG. 16A), a front view (FIG. 16B) and a perspective view (FIG. 16C) of an SiC single crystal produced by using the a-plane growth method of the present invention.

When an a-plane grown crystal having a large diameter of the {0001} plane is produced by using the a-plane growth method of the present invention, if production conditions are optimized, the Si-plane side facet region is formed at the periphery of the growing crystal. Therefore, even if the nuclei of differently oriented crystals or heterogeneous polytype crystals are formed in the Si-plane side facet region and grown into masses along the growth of SiC, they exist at the periphery of the growing crystal.

The term "20% of the region from the periphery" means a region from the surface of the growing crystal to a distance corresponding to 0.2x as shown in FIGS. 16A to 16C. "x" is the distance from the center to the surface of the growing crystal.

The term "containing no differently oriented crystals or no heterogeneous polytype crystals" means that clumped differently oriented crystals or clumped heterogeneous polytype crystals having a volume of more than 1 mm$^3$ are not contained.

When the production conditions are further optimized, an SiC crystal containing no differently oriented crystalline masses or no heterogeneous polytype crystalline masses, or a SiC single crystal containing substantially no differently oriented crystalline masses or no heterogeneous polytype crystalline masses is obtained in a region excluding 10% of the region from the periphery.

[6.2. Diameter]

The a-plane growth method according to the present invention can produce an a-plane grown crystal having a large diameter of the {0001} plane efficiently. Stated more specifically, when the production conditions are optimized, an SiC single crystal having a diameter of the {0001} plane of 100 mm or more, or 150 mm or more, is obtained.

[6.3. Facet Mark]

Figure 17:
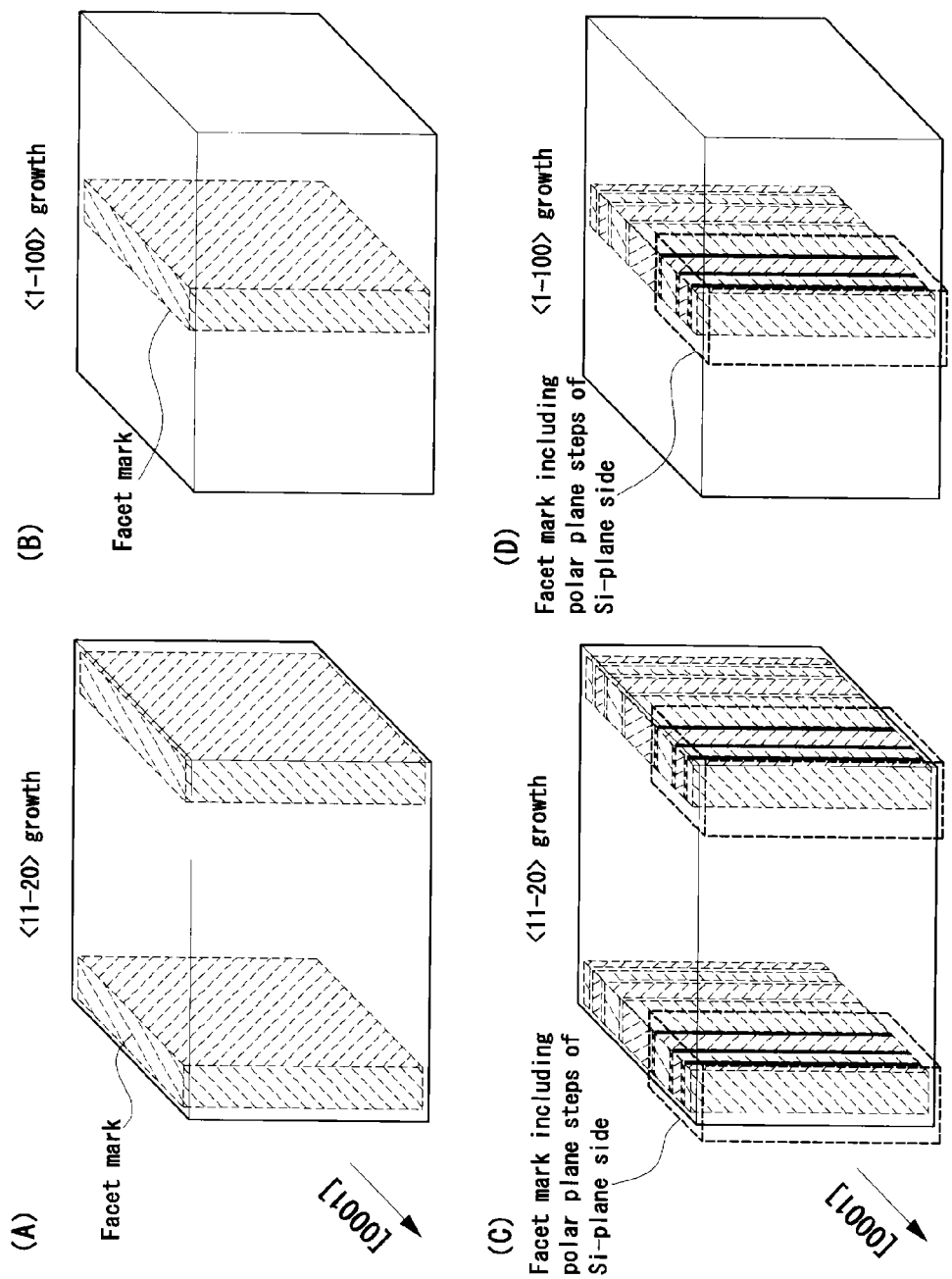
FIGS. 17A and 17B are schematic diagrams of a {1-100} plane facet mark formed in an SiC single crystal grown on the a-plane.
FIGS. 17C and 17D are schematic diagrams of a {1-100} plane facet mark (striped facet mark) including polar plane steps of Si-plane side.

FIG. 17 show schematic diagrams of {1-100} plane facet marks formed in an SiC single crystal grown on the a-plane (FIGS. 17A and 17B) and schematic diagrams of {1-100} plane facet marks including polar plane steps of Si-plane side (FIGS. 17C and 17D).

When {11-20} plane growth is carried out, the facet region is formed at the ends of the growing crystal. Therefore, as shown in FIG. 17A, the {1-100} plane facet marks (hatched areas) appear at the ends of the growing crystal.

Meanwhile, when {1-100} plane growth is carried out, as shown in FIG. 17B, the {1-100} plane facet mark appears at the center of the growing crystal. Since the {1-100} plane facet mark includes polar plane steps of Si-plane side and is a region where differently oriented crystals or heterogeneous polytype crystals tend to be produced, the lower the volume ratio of the facet mark is, the better.

In the above-described a-plane growth method, when the means of reducing the area of the facet region itself is taken, the volume ratio of the {1-100} plane facet mark (the ratio of the volume of the {1-100} plane facet mark to the volume of the grown crystal) can be reduced. More specifically, by optimizing the production conditions, an SiC single crystal having a volume ratio of the {1-100} plane facet mark of 40% or less, or 20% or less, is obtained.

When a-plane growth is carried out, the polar plane steps of Si-plane side are generally formed in the facet region. When the polar plane steps of Si-plane side are formed in the facet region, a facet mark with stripes appears.

When {11-20} plane growth is carried out, as shown in FIG. 17C, the {1-100} plane facet marks including the polar plane steps of Si-plane side (to be also referred to as "striped facet marks" hereinafter) occupy the Si-plane near side (area surrounded by a bold broken line) out of the facet marks formed at both ends.

Similarly, when {1-100} plane growth is carried out, the striped facet mark occupies the Si-plane near side out of the facet mark formed at the center. Since the striped facet mark is an area where differently oriented crystals or heterogeneous polytype crystals tend to be produced, the lower its volume ratio is, the better.

In the above-described a-plane growth method, when the means of reducing the area of the facet region itself or the means of shrinking the Si-plane side facet region is taken, the volume ratio of the striped facet mark (the ratio of the volume of the striped facet mark to the volume of the growing crystal) can be reduced. More specifically, by optimizing the production conditions, an SiC single crystal having a volume ratio of the striped facet mark of 20% or less, or 10% or less, is obtained.

[7. SiC Wafer, SiC Single Crystal (c-Plane Grown Crystal)]

The SiC wafer according to the first embodiment of the present invention is cut out from an SiC single crystal (a-plane grown crystal) obtained by using the a-plane growth method, and its widest plane is substantially {0001} plane (that is, plane having an absolute value of offset angle from the {0001} plane of 30° or less).

The obtained SiC wafer may be used for various purposes as it is. Or, an SiC single crystal (c-plane grown crystal) may be produced by using the obtained SiC wafer as a seed crystal.

Further, the SiC wafer according to the second embodiment of the present invention is cut out from the SiC single crystal (c-plane grown crystal) obtained as described above. The obtained SiC wafer may be used for various purposes.

[8. Semiconductor Device]

The semiconductor device according to the present invention is manufactured by using the SiC single crystal or SiC wafer of the present invention. Specific examples of the semiconductor device include (a) LED and (b) diodes and transistors for power devices.

While embodiments of the present invention have been described in detail, the present invention is not limited thereto but may be otherwise variously embodied without departing from the spirit or scope of the invention.

The SiC single crystal production method according to the present invention can be used to produce an SiC single crystal which can be used as a semiconductor material for ultra-low power loss power devices.

What is claimed is:

1. A method for producing an SiC single crystal, having the following constitution:
   (a) the method for producing an SiC single crystal repeats an a-plane growth step n (n≥2) times;
   (b) a first a-plane growth step is a step for carrying out the a-plane growth of an SiC single crystal on a first growth plane by using a first seed crystal having the first growth plane with an offset angle from the {0001} plane of 80° to 100°;
   (c) a k-th a-plane growth step (2≤k≤n) is a step for cutting out a k-th seed crystal having a k-th growth plane with a growth direction 45° to 135° different from the growth direction of a (k−1)-th a-plane growth step and an offset angle from the {0001} plane of 80° to 100° from a (k−1)-th grown crystal obtained in the (k−1)-th a-plane growth step, and carrying out the a-plane growth of an SiC single crystal on the k-th growth plane; and
   (d) the k-th a-plane growth step (1≤k≤n) is a step for carrying out the a-plane growth of an SiC single crystal on the k-th growth plane so that an area ratio $S_{facet}$ of a Si-plane side facet region represented by the equation (A) is maintained at 20% or less:

$$S_{facet}(\%) = S_1 \times 100/S_2 \qquad (A)$$

where $S_1$ is the sum of the total area of areas obtained by projecting polar plane steps of Si-plane side on the k-th growth plane and the total area of areas obtained by projecting {1-100} plane facets sandwiched between the polar plane steps of Si-plane side on the k-th growth plane, and $S_2$ is the total area of the k-th growth plane.

2. The method for producing an SiC single crystal according to claim 1,
   wherein the first a-plane growth step is a step for growing the SiC single crystal on the {11-20} plane by using the first seed crystal having the first growth plane with an offset angle $\theta_1$ from the {11-20} plane of −15° to 15°, and
   the k-th a-plane growth step (2≤k≤n) is a step for cutting out the k-th seed crystal having the k-th growth plane with a growth direction about 60° or about 120° different from the growth direction of the (k−1)-th a-plane growth step and an offset angle $\theta_k$ from the {11-20} plane of −15° to 15° from the (k−1)-th grown crystal obtained in the (k−1)-th a-plane growth step, and carrying out the {11-20} plane growth of the SiC single crystal by using the k-th seed crystal.

3. The method for producing an SiC single crystal according to claim 2, wherein the k-th a-plane growth step (1≤k≤n−1) is a step for carrying out the {11-20} plane growth of SiC on the k-th growth plane so that the relationship of the following expression (1) is established.

$$H_k > L_k \sin(60° + |\theta_k| + |\theta_{k+1}|) \qquad (1)$$

where $H_k$ is a growth height in the k-th a-plane growth step, $L_k$ is a length in the {0001} plane direction of the k-th growth plane of the k-th seed crystal, and $\theta_k$ and $\theta_{k+1}$ have opposite signs and their rotation directions are directions for increasing a length $L_{k+1}$ in the {0001} plane direction of the (k+1)-th growth plane of a (k+1)-th seed crystal.

4. The method for producing an SiC single crystal according to claim 2, wherein the k-th a-plane growth step (2≤k≤n) is a step for cutting out the k-th seed crystal having the relationship of the following expression (2) from the (k−1)-th grown crystal, and carrying out the {11-20} plane growth of the SiC single crystal on the k-th growth plane:

$$L_k \approx H_{k-1}/\cos(30° - |\theta_{k-1}| - |\theta_k|) \qquad (2)$$

where $H_{k-1}$ is a growth height in the (k−1)-th growth step, $L_k$ is a length in the {0001} plane direction of the k-th growth plane of the k-th seed crystal, and $\theta_{k+1}$ and $\theta_k$ have opposite signs and their rotation directions are directions for increasing $L_k$.

5. The method for producing an SiC single crystal according to claim 2, wherein the k-th a-plane growth step (1≤k≤n−1) is a step for carrying out the {11-20} plane growth of the SiC single crystal on the k-th growth plane such that the following expression (3) is satisfied:

$$H_k \geq L_k \tan(60° + |\theta_k| + |\theta_{k+1}|) \qquad (3)$$

where $H_k$ is a growth height in the k-th a-plane growth step, $L_k$ is a length in the {0001} plane direction of the k-th growth plane of the k-th seed crystal, and $\theta_k$ and $\theta_{k+1}$ have opposite signs and their rotation directions are directions for increasing the length $L_{k+1}$ in the {0001} plane direction of the (k+1)-th growth plane of the (k+1)-th seed crystal.

6. The method for producing an SiC single crystal according to claim 2, wherein the k-th a-plane growth step (2≤k≤n) is a step for cutting out the k-th seed crystal from the (k−1)-th grown crystal so that the following expression (4) is satisfied, and carrying out the {11-20} plane growth of the SiC single crystal on the k-th growth plane:

$$L_{k-1} \approx L_{k-1}/\sin(30°-|\theta_{k-1}|-|\theta_k|) \quad (4)$$

where $L_{k-1}$ is a length in the {0001} plane direction of the (k−1)-th growth plane of the (k−1)-th seed crystal, $L_k$ is a length in the {0001} plane direction of the k-th growth plane of the k-th seed crystal, and $\theta_{k-1}$ and $\theta_k$ have opposite signs and their rotation directions are directions for increasing $L_k$.

7. The method for producing an SiC single crystal according to claim 2, wherein the k-th a-plane growth step (2≤k≤n) is a step for cutting the (k−1)-th grown crystal obtained in the (k−1)-th a-plane growth step along the k-th growth plane having a growth direction about 60° or about 120° different from the growth direction of the (k−1)-th a-plane growth step and an offset angle $\theta_k$ from the {11-20} plane of −15° to 15° so that most of the (k−1)-th grown crystal remains, and carrying out the {11-20} plane growth of the SiC single crystal by using the (k−1)-th grown crystal from which the k-th growth plane is exposed as the k-th seed crystal.

8. The method for producing an SiC single crystal according to claim 2, wherein $|\theta_{k-1}|=|\theta_k|(2\le k\le n)$.

9. The method for producing an SiC single crystal according to claim 1,
wherein the first a-plane growth step is a step for carrying out the {1-100} plane growth or {11-20} plane growth of the SiC single crystal by using the first seed crystal having the first growth plane with an offset angle $\theta_1$ from the {1-100} plane or {11-20} plane of −15° to 15°, and
the k-th a-plane growth step (2≤k≤n) is a step for cutting out the k-th seed crystal having the k-th growth plane with a growth direction about 90° different from the growth direction of the (k−1)-th a-plane growth step and an offset angle $\theta_k$ from the {11-20} plane or {1-100} plane of −15° to 15° from the (k−1)-th grown crystal obtained in the (k−1)-th a-plane growth step, and carrying out {11-20} plane growth or {1-100} plane growth of the SiC single crystal by using the k-th seed crystal.

10. The method for producing an SiC single crystal according to claim 1, wherein the k-th a-plane growth step (1≤k≤n) is a step for carrying out the {1-100} plane growth or {11-20} plane growth of the SiC single crystal so that the topmost portion of the {1-100} plane facet is situated on the Si-plane near side with respect to the center in the c-axis direction of the k-th growth plane.

11. The method for producing an SiC single crystal according to claim 10, wherein the k-th a-plane growth step (1≤k≤n) is a step for carrying out the {1-100} plane growth or {11-20} plane growth of the SiC single crystal so that the temperature on the Si-plane near side with respect to the center in the c-axis direction of the k-th growth plane becomes lower than that at the center in the c-axis direction.

12. The method for producing an SiC single crystal according to claim 10, wherein the k-th a-plane growth step (1≤k≤n) is a step for carrying out the {1-100} plane growth or {11-20} plane growth of the SiC single crystal so that the concentration of SiC gas on the Si-plane near side with respect to the center in the c-axis direction of the k-th growth plane becomes higher than that at the center in the c-axis direction.

13. The method for producing an SiC single crystal according to claim 10, wherein when the k-th a-plane growth step (1≤k≤n) is a step for carrying out the {11-20} plane growth of the SiC single crystal, the k-th a-plane growth step is a step for carrying out the {11-20} plane growth of SiC by using the k-th seed crystal having a larger length on the Si-plane near side with respect to the center in the c-axis direction than that on the C-plane near side.

14. The method for producing an SiC single crystal according to claim 1, wherein the k-th a-plane growth step (1≤k≤n) is a step for carrying out the {1-100} plane growth or {11-20} plane growth of SiC by using the k-th seed crystal obtained by joining together at least two seed crystal segments in such a manner that their Si-planes are opposed to each other.

15. The method for producing an SiC single crystal according to claim 1, wherein when the k-th a-plane growth step (1≤k≤n) is a step for carrying out the {1-100} plane growth of the SiC single crystal, the k-th a-plane growth step is a step for carrying out the {1-100} plane growth of the SiC single crystal so that the area of a region having a height difference of 1 mm or less within the facet region accounts for 90% or more of the total area of the facet region.

16. The method for producing an SiC single crystal according to claim 1, wherein the k-th a-plane growth step (1≤k≤n) is a step for carrying out the {1-100} plane growth or {11-20} plane growth of SiC by using the k-th seed crystal obtained by placing a dummy seed crystal next to the main seed crystal.

17. The method for producing an SiC single crystal according to claim 1, wherein when the k-th a-plane growth step (1≤k≤n) is a step for carrying out the {1-100} plane growth of the SiC single crystal, the k-th a-plane growth step is a step for carrying out the {1-100} plane growth of the SiC single crystal so that the surface of the k-th grown crystal becomes convex in the {0001} plane direction, that is, r<L is satisfied when "L" represents the length in the {0001} plane direction of the k-th grown crystal and "r" represents the curvature in the {0001} plane direction of the surface of the k-th grown crystal.

18. The method for producing an SiC single crystal according to claim 17, wherein the k-th a-plane growth step (1≤k≤n) is a step for carrying out the {1-100} plane growth of the SiC single crystal so that the topmost portion of the {1-100} plane facet is situated on the end side with respect to the center in the c-plane direction of the k-th growth plane.

19. The method for producing an SiC single crystal according to claim 1, wherein the k-th a-plane growth step (1≤k≤n) is a step for carrying out the {1-100} plane growth or {11-20} plane growth of SiC in an atmosphere in which the nitrogen gas partial pressure is 5% or less.

20. The method for producing an SiC single crystal according to claim 1, wherein the k-th a-plane growth step (1≤k≤n) is a step for carrying out the a-plane growth of the SiC single crystal on the k-th growth plane by using the k-th seed crystal having the k-th growth plane with an offset angle from the {0001} plane of more than 85° to less than 95°.

21. The method for producing an SiC single crystal according to claim 1, further comprising the following constitution:
(e) the method for producing an SiC single crystal comprises a c-plane growth step for cutting out a (n+1)-th seed crystal having a (n+1)-th growth plane with an absolute value of offset angle from the {0001} plane of 30° or less from the n-th grown crystal, and carrying out the c-plane growth of the SiC single crystal on the (n+1)-th growth plane.

22. An SiC single crystal which is obtained by the method of claim 1 and does not contain differently oriented crystalline masses or heterogeneous polytype crystalline masses in a region excluding 20% of the region from the periphery.

23. The SiC single crystal according to claim 22 which does not contain the differently oriented crystalline masses or the heterogeneous polytype crystalline masses in a region excluding 10% of the region from the periphery.

24. The SiC single crystal according to claim 22, wherein a diameter of the {0001} plane is 100 mm or more.

25. The SiC single crystal according to claim 22, wherein a diameter of the {0001} plane is 150 mm or more.

26. The SiC single crystal according to claim 22, wherein a volume ratio of a {1-100} plane facet mark is 40% or less.

27. The SiC single crystal according to claim 22, wherein a volume ratio of the {1-100} plane facet mark is 20% or less.

28. The SiC single crystal according to claim 22, wherein a volume ratio of the {1-100} plane facet mark including polar plane steps of Si-plane side is 20% or less.

29. The SiC single crystal according to claim 22, wherein a volume ratio of the {1-100} plane facet mark including polar plane steps of Si-plane side is 10% or less.

30. An SiC wafer which is cut out from the SiC single crystal of claim 22 and whose widest plane has an absolute value of offset angle from the {0001} plane of 30° or less.

31. An SiC single crystal obtained by carrying out c-plane growth using the SiC wafer of claim 30.

32. An SiC wafer cut out from the SiC single crystal of claim 31.

33. A semiconductor device produced by using the SiC single crystal of claim 22.

34. The semiconductor device according to claim 33 which is a diode, transistor or LED.

\* \* \* \* \*

UNITED STATES PATENT AND TRADEMARK OFFICE
CERTIFICATE OF CORRECTION

| | |
|---|---|
| PATENT NO. | : 9,096,947 B2 |
| APPLICATION NO. | : 14/119710 |
| DATED | : August 4, 2015 |
| INVENTOR(S) | : Itaru Gunjishima et al. |

Page 1 of 1

It is certified that error appears in the above-identified patent and that said Letters Patent is hereby corrected as shown below:

On the title page, Item (54), and Column 1, the Title is incorrect. Item (54) and Column 1 should read:

--SiC SINGLE CRYSTAL, PRODUCTION METHOD THEREFOR, SiC WAFER AND SEMICONDUCTOR DEVICE--

Signed and Sealed this
Fifth Day of January, 2016

Michelle K. Lee
*Director of the United States Patent and Trademark Office*